(12) United States Patent
Ruffoni et al.

(10) Patent No.: US 12,396,111 B2
(45) Date of Patent: Aug. 19, 2025

(54) ELECTRONIC DEVICE, FOLDABLE-SLIDER DEVICE, AND METHOD FOR DISPLAYING INFORMATION

(71) Applicant: GUANGDONG OPPO MOBILE TELECOMMUNICATIONS CORP., LTD., Guangdong (CN)

(72) Inventors: Roberto Ruffoni, Guangdong (CN); Jintong Zhu, Guangdong (CN); Elinor Portnoy Priell, Guangdong (CN); Massimo Marolda, Guangdong (CN); Anne-Marie Heck, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 186 days.

(21) Appl. No.: 18/512,620

(22) Filed: Nov. 17, 2023

(65) Prior Publication Data

US 2024/0098914 A1    Mar. 21, 2024

Related U.S. Application Data

(63) Continuation of application No. PCT/CN2021/094186, filed on May 17, 2021.

(51) Int. Cl.
*H04M 1/02* (2006.01)
*H05K 5/02* (2006.01)

(52) U.S. Cl.
CPC ............................... *H05K 5/0221* (2013.01)

(58) Field of Classification Search
None
See application file for complete search history.

(56) References Cited

U.S. PATENT DOCUMENTS 9,900,488 B2 *  2/2018  Xu ..................... H04N 23/90
10,359,809 B2 * 7/2019  Kwak ................. G06F 3/04886
(Continued)

FOREIGN PATENT DOCUMENTS

CN    105830422 A    8/2016
CN    105980972 A    9/2016
(Continued)

OTHER PUBLICATIONS

News coverage:https://www.ithome.com/0/524/634.htm;OPPO showcases the "sliding" concept of mobile phones: featuring a three hinge folding design concept Published Dec. 14, 2020.
(Continued)

*Primary Examiner* — Xanthia C Relford
(74) *Attorney, Agent, or Firm* — Ladas & Parry LLP

(57) ABSTRACT

An electronic device, a foldable-slider device, and a method for displaying information are disclosed. The electronic device may include a housing assembly (10) and a display screen (20). The housing assembly (10) may include a first housing portion (11), a second housing portion (12), and a foldable portion (13). The display screen (20) may have a shortcut display area (211). In a condition of the foldable portion (13) being in a folded state, the second housing portion (12) can be enabled to slide between a first folded position where the shortcut display area (211) is covered by the second housing portion (12) and a second folded position where the shortcut display area (211) is exposed from the second housing portion (12).

20 Claims, 15 Drawing Sheets

(56) References Cited

U.S. PATENT DOCUMENTS

| | | | |
|---|---|---|---|
| 10,498,380 B2* | 12/2019 | Debates | G06F 1/1652 |
| 10,754,386 B2* | 8/2020 | Lee | G06F 1/1624 |
| 11,470,933 B2* | 10/2022 | Lee | H04M 1/185 |
| 2016/0070303 A1* | 3/2016 | Lee | G06F 1/1616 |
| | | | 361/679.27 |
| 2017/0169741 A1* | 6/2017 | Lim | H04M 1/0247 |
| 2017/0310799 A1* | 10/2017 | Lin | H04M 1/0268 |
| 2020/0348729 A1 | 11/2020 | Koh | |

FOREIGN PATENT DOCUMENTS

| | | |
|---|---|---|
| CN | 107580774 A | 1/2018 |
| CN | 107688370 A | 2/2018 |
| CN | 108345358 A | 7/2018 |
| CN | 109891859 A | 6/2019 |
| CN | 209120234 U | 7/2019 |
| CN | 110445907 A | 11/2019 |
| CN | 111866219 A | 10/2020 |
| CN | 109495621 B | 3/2021 |
| WO | 2021085985 A1 | 5/2021 |

OTHER PUBLICATIONS

News coverage:https://blog.csdn.net/weixin_39548606/article/details/112675960;Phone sliding_ Xiaomi folding screen mobile phone patent exposure, not only can fold but also slide, Published Jan. 14, 2021.

International Search Report and Written Opinion, International Patent Application No. PCT/CN2021/094186, mailed Feb. 21, 2022 (11 pages).

* cited by examiner

ELECTRONIC DEVICE, FOLDABLE-SLIDER DEVICE, AND METHOD FOR DISPLAYING INFORMATION

CROSS REFERENCE TO RELATED APPLICATIONS

This application is a continuation of International Patent Application No. PCT/CN2021/094186 filed on May 17, 2021, which is herein incorporated by reference in its entirety.

TECHNICAL FIELD

The described embodiments relate to electronic technology, and in particular relates to an electronic device, a foldable-slider device, and a method for displaying information.

BACKGROUND

Nowadays, foldable electronic devices are becoming increasingly popular among users. In order to protect a display screen of an electronic device, the display screen is usually configured to be folded inside when the electronic device is closed, which reduces the convenience of the product.

SUMMARY

In one embodiment, the present disclosure provides an electronic device. The electronic device may include a housing assembly and a display screen. The housing assembly may include a first housing portion, a second housing portion, and a foldable portion. The first housing portion and the second housing portion may be spaced from each other. The foldable portion may include two opposite ends. One end of the two opposite ends may be connected to the first housing portion. The other end of the two opposite ends may be connected to the second housing portion. The display screen may be connected to the housing assembly. The display screen may cover the first housing portion, the second housing portion, and the foldable portion. The display screen may have a shortcut display area. The shortcut display area may cover a part of the first housing portion away from the foldable portion. In a condition of the foldable portion being in a folded state, the two opposite ends may be configured to be slidable relative to each other such that the second housing portion may be enabled to slide between a first folded position where the shortcut display area is covered by the second housing portion and a second folded position where the shortcut display area is exposed from the second housing portion.

In another embodiment, the present disclosure provides a method for displaying information for an electronic device. The electronic device may include a housing assembly and a display screen. The housing assembly may include a first housing portion, a second housing portion, and a foldable portion. The foldable portion may include two opposite ends. One end of the two opposite ends may be connected to the first housing portion. The other end of the two opposite ends may be connected to the second housing portion. The display screen may cover the first housing portion, the second housing portion, and the foldable portion. The display screen may have a shortcut display area. The shortcut display area may cover a part of the first housing portion away from the foldable portion. In a condition of the foldable portion is being in a folded state, the two opposite ends are configured to be slidable relative to each other such that the second housing portion may be enabled to slide between a first folded position where the shortcut display area is covered by the second housing portion and a second folded position where the shortcut display area is exposed from the second housing portion. The method may include displaying a first data on the shortcut display area in response to the second housing portion sliding to the second folded position from the first folded position.

In another embodiment, the present disclosure provides a foldable-slider device. The foldable-slider device may include a first part and a second part. The first part may have a first display surface. The second part may be connected with the first part. The second part may have a second display surface. The second part may be configured to slide relative to the first part between a first state and a second state in a condition of the device being folded. An area of the first display surface of the first part may gradually increase and an area of the second display surface of the second part may gradually decrease in response to a slide of the second part from the first state to the second state. The area of the first display surface of the first part may gradually decrease and the area of the second display surface of the second part may gradually increase in response to a slide of the second part from the second state to the first state.

BRIEF DESCRIPTION OF THE DRAWINGS

In order to make the technical solution described in the embodiments of the present disclosure more clear, the drawings used for the description of the embodiments will be briefly described. Apparently, the drawings described below are only for illustration but not for limitation. It should be understood that, one skilled in the art might acquire other drawings based on these drawings, without paying any creative efforts.

DETAILED DESCRIPTION

Technical solutions of the embodiments of the present disclosure may be clearly and comprehensively described by referring to accompanying figures of the embodiments. Obviously, embodiments to be described are only a part of, but not all of, the embodiments of the present disclosure. Any ordinary skilled person in the art may obtain other embodiments based on the embodiments of the present disclosure without any creative work, and the other embodiments should be included in the scope of the present disclosure.

Figure 1:
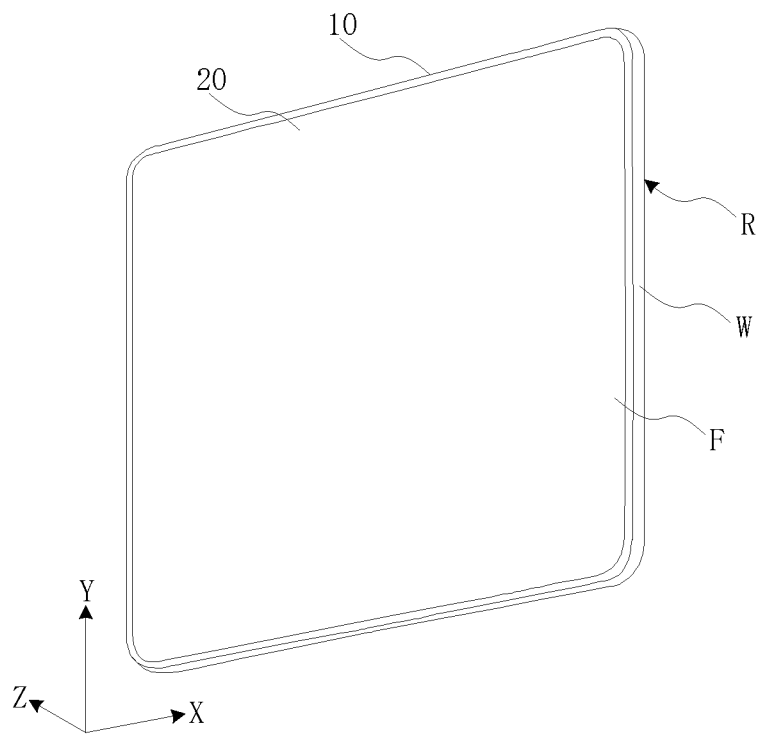
FIG. 1 is a schematic structural view of an electronic device according to an embodiment of the present disclosure under a fully-open state.

FIG. 1 depicts an embodiment of an electronic device. The electronic device may be a portable electronic device such as a cellular telephone, a tablet, an e-reader, or the like.

As illustrated in FIG. 1, the electronic device may include a housing assembly 10 and a display screen 20. The housing assembly 10 may serve as a supporting frame and be configured to mount the display screen 20. The display screen 20 may be connected to the housing assembly 10 and viewable through a side of the electronic device. The housing assembly 10 may be formed from materials such as polymer, glass, metal, crystalline materials such as sapphire, ceramic, fabric, foam, wood, other materials, and/or combinations of these materials. The display screen 20 may include any type of display screen for example a liquid crystal display, a light emitting diode display, an organic light-emitting diode display, a 3D display, and so on. In some embodiments, different parts of the display screen 20 may be of different types.

The housing assembly 10 may form at least a portion of an exterior surface of the electronic device. In some embodiments, the housing assembly 10 may at least partially surround the display screen 20. In some embodiments, the housing assembly 10 may form a backing or backing layer along a back face of the display screen 20. In some cases, the housing assembly 10 may be integrally formed with the display screen 20.

In details, the electronic device may have a front face F, an opposing rear face R, and several sidewalls W. The rear face R may be formed by a back face of the housing assembly 10 away from the display screen 20, and the front face F may be constituted of a display surface of the display screen 20 and an extension of the back face of the housing assembly 10. The extension of the back face of the housing assembly 10 may surround the display surface. In some embodiments, the front face F may be only formed by the display surface of the display screen 20, and not by the extension of the back face of the housing assembly 20.

Sidewalls W may be formed by an extension of the housing assembly 10, an extension of the display screen 20, or combinations of the extension of the housing assembly 10 and the extension of the display screen 2, and/or may be formed using one or more separate sidewall members (as examples). Sidewalls W may be planar (e.g., to form vertical sidewalls extending between front F and rear R) and/or may have curved cross-sectional profiles. As a case, input-output devices such as one or more physical buttons may be mounted on the sidewalls W.

In addition, each of the housing assembly 10 and the display screen 20 may have a planar shape, a shape with a curved cross-sectional profile, or other suitable shape. In the embodiment of FIG. 1, each of the front face F and the rear face R may have a planar shape and lie in the X-Y plane. The display screen may have a rectangular or a rectangular-like outline or other suitable outline. The electronic device may be elongated along the X axis. A thickness of the electronic device in dimension Z may be less than a length of the electronic device in dimension X and less than a width of the electronic device in dimension Y.

To help satisfy a user's desire for compactness and portability while satisfying a user's desire for large-screen display, the electronic device can have structures that allow the shape and size of the electronic device to be adjusted. In particular, the structures can support folding motions and/or other behavior that allows the electronic device to be adjusted during use.

When compact size is desired, the electronic device can be adjusted to be compact. The electronic device may, as an example, be folded inwardly or outwardly about a bending axis. When a large screen size is desired, the housing assembly 10 and the display screen 20 can be unfolded in one or more directions such as a direction parallel to the X axis or a direction perpendicular to the X axis and perpendicular to the thickness of the electronic device. When expanded, the display screen 20 can exhibit an expanded viewable area.

Figure 2:
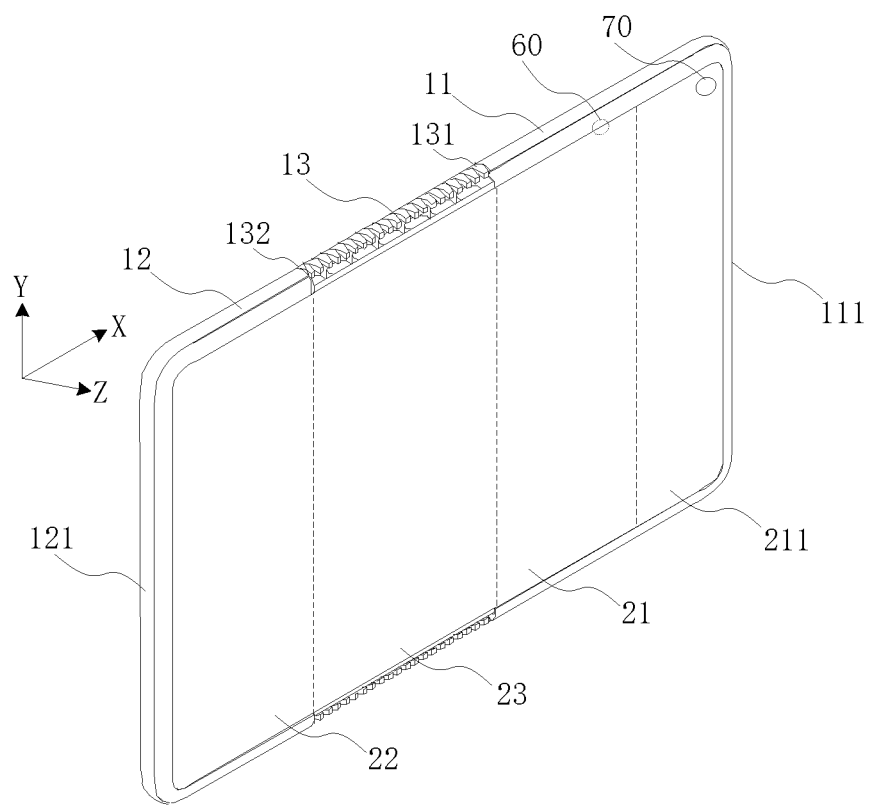
FIG. 2 is a schematic structural view of an electronic device according to another embodiment of the present disclosure under a fully-open state.

FIG. 2 illustrates the electronic device in detail. In the embodiment in FIG. 2, the housing assembly may include a first housing portion 11, a second housing portion 12, and a foldable portion 13. The first housing portion 11 and the second housing portion 12 may be spaced from each other. The foldable portion 13 may include two opposite ends (131, 132) arranged along the X axis. The first housing portion 11 may include a first end 111, and the second housing portion 12 may include a second end 121. One end 131 of the two opposite ends (131, 132) may be connected to an end of the first housing portion 11 away from the first end 111, and the other end 132 of the two opposite ends (131, 132) may be connected to an end of the second housing portion 12 away from the second end 121.

A size of the first housing portion 11, a size of the second housing portion 12, and a size of the foldable portion 13 along the X axis may be equal to each other or not. In the embodiment of FIG. 2, the size of the second housing portion 12 and the size of the foldable portion 13 may be smaller than the size of the first housing portion 11. In some other embodiments, the size of the first housing portion 11 may be approximately equal to the size of the second housing portion 12, but greater than the size of the foldable portion 13, and the first housing portion 11 and the second housing portion 12 may be substantially arranged symmetrically on both sides of the foldable portion 13.

The first housing portion 11, the second housing portion 12, and the foldable portion 13 may have a same shape or different shapes. In some embodiments, shapes of the first housing portion 11, the second housing portion 12, and the foldable portion 13 may be changeless, or may change with a state of the electronic device varying. In the embodiment of the FIG. 2, each of the first housing portion 11 and the second housing portion 12 may have a rectangular shape which is changeless. However, a shape of the foldable portion 13 may be variable as the state of the electronic device changes.

In detail, the foldable portion 13 may be foldably provided and may have one or more bending axes around which the foldable portion 13 can be folded or unfolded. In this way, the second housing portion 12 can be folded or unfolded relative to the first housing portion 11, and the state of the electronic device can be adjusted.

As an example, the foldable portion 13 may include a hinge to achieve its foldable function. Two ends (131, 132) of the hinge may be connected to the first housing portion 11 and the second housing portion 12 to drive the first housing portion 11 and the second housing portion 12 to perform corresponding actions while the hinge being folded or unfolded. In some embodiments, the foldable portion 13 may include a flexible appearance layer. The flexible appearance layer may be connected to a side of the hinge away from the display screen 20 and connected between the first housing portion 11 and the second housing portion 12, such that the side of the housing assembly 10 away from the display screen 20 can have a consistent and smooth appearance surface.

In some embodiments, both the first housing portion 11 and the second housing portion 12 have some mounting structures. The display screen 20 may be mounted to the first housing portion 11 and the second housing portion 12 by these mounting structures. In some embodiments, all of the first housing portion 11, the second housing portion 12, and the foldable portion 13 may include mounting structures by which the display screen 20 may be mounted to the housing assembly 10. In detail, the display screen 20 may be mounted to the housing assembly 10 by at least one of screwing, snap-fitting, gluing, and other mounting methods.

In the embodiment in FIG. 2, the display screen 20 may have a first display area 21, a second display area 22, and a foldable display area 23. Each area may be a different area of a display surface of the display screen 20. The first display area 21 may include a shortcut display area 211. The foldable display area 23 may be connected between the first display area 21 and the second display area 22. The shortcut display area 211 may be a part of the first display area 21 covering a part of the first housing portion 11 away from the foldable portion 13 and adjacent to the first end 111. A size of the shortcut display area 211 may be smaller than a size of the first display area 21, and may also be smaller than a size of the foldable display area 23 and a size of the second display area 22. In some other embodiments, the shortcut display area 211 may be the same as the first display area 21.

Similar to the housing assembly 10, the first display area 21, the second display area 22, and the foldable display area 23 may have a same shape or different shapes. In some embodiments, shapes of the first display area 21, the second display area 22, and the foldable display area 23 may be changeless, or may change with a state of the electronic device varying. In the embodiment of the FIG. 2, each of the first display area 11 and the second display area 12 may have a rectangular shape which is changeless. However, a shape of the foldable display area 23 may be variable as the shape of the foldable portion 13 changes.

A size of the first display area 21, a size of the second display area 22, and a size of the foldable display area 23 may be equal or not. In the embodiment of FIG. 2, each of the size of the second display area 22 and the size of the foldable display area 23 may be smaller than the size of the first display area 21. In a case, the size of the first display area 21 may be approximately a half of a size of an entire display surface of the display screen 20. In another example, the size of the first display area 21 may be approximately equal to the size of the second display area 22, but greater than the size of the foldable display area 23, and the first display area 21 and the second display area 22 may be substantially arranged symmetrically on both sides of the foldable display area 23.

Moreover, the first display area 21 may cover the first housing portion 11, the shortcut display area 211 may cover a part of the first housing portion 11 away from the foldable portion 13 and adjacent to the first end 111, the second display area 22 may cover the second housing portion 12, and the foldable display area 23 may cover the foldable portion 13. In the embodiment of FIG. 2 in conjunction with FIG. 1, a first part of sidewalls W closing to the first display area 21 may be formed by an extension of the first housing portion 11, a second part of sidewalls W closing to the second display area 22 may be formed by an extension of the second housing portion 12, and a third part of sidewalls W closing to the foldable display area 23 may be formed by an extension of the foldable portion 13. In this embodiment, a vertical projection of the first display area 21 on the front face F may cover a part of a vertical projection of the first housing portion 11, a vertical projection of the second display area 22 on the front face F may also cover a part of a vertical projection of the second housing portion 12, and a vertical projection of the foldable display area 23 on the front face F may also cover a part of a vertical projection of the foldable portion 13. In some other embodiments, the vertical projection of the first display area 21 and the vertical projection of the first housing portion 11 may coincide with each other. Similarly, the vertical projection of the second display area 22 and the vertical projection of the second housing portion 12 may coincide with each other, and the vertical projection of the foldable display area 23 may also coincide with the vertical projection of the foldable portion 13.

In detail, the foldable display area 23 may be flexible such that it can be folded or unfolded to adapt to the foldable portion 13. The first display area 21 and the second display area 22 can be flexible or rigid, and it is not limited herein.

Figure 3:
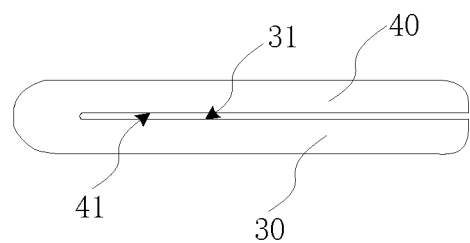
FIG. 3 is a schematic structural view of an electronic device according to an embodiment of the present disclosure under a fully-closed state.
Figure 4:
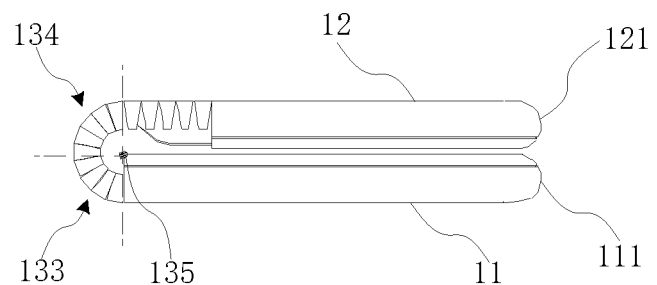
FIG. 4 is a schematic structural view of an electronic device according to another embodiment of the present disclosure under a fully-closed state.
Figure 5:
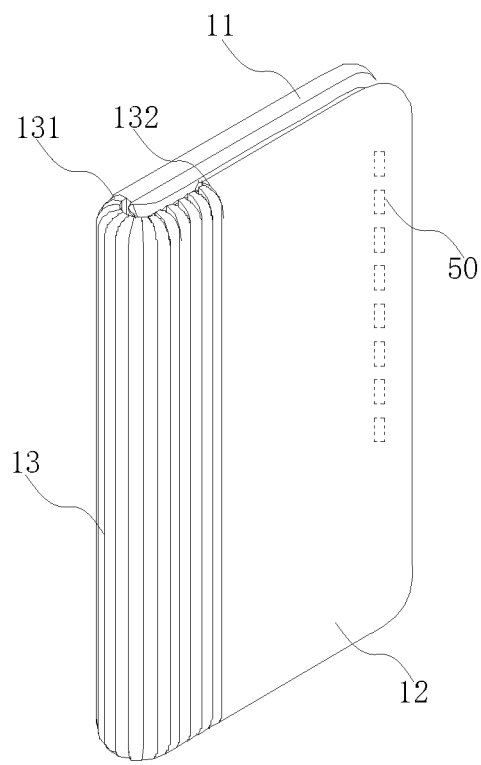
FIG. 5 is a schematic structural view of an electronic device according to another embodiment of the present disclosure under a fully-closed state.

It can be seen that, in the embodiment of FIG. 2, the electronic device is in a fully-open state, large in size and not portable. To help satisfy a user's desire for compactness and portability, the electronic device can be folded inwardly to be in a fully-closed state as illustrated in FIGS. 3-5.

Before the electronic device in the fully-closed state being described, the structure of the electronic device is described again in conjunction with FIGS. 2-5 here.

The electronic device may be divided into two parts along a bending axis of the foldable portion 13. The two parts may include a first part 30 and a second part 40 connected with each other. The first part 30 may include the first housing portion 11, a first section 133 of the foldable portion 13, and a portion of the display screen 20 covering the first housing portion 11, the first section 133. The second part 40 may include the second housing portion 12, a second section 134 of the foldable portion 13, and a portion of the display screen 20 covering the second housing portion 12 and the second section 134. The first section 133 and the second section 134 may be arranged at each side of the bending axis along which the electronic device is divided into the two parts.

The first part 30 may have a first display surface 31. The second part 40 may have a second display surface 41 which is connected with the first surface 31 to form an entire display surface of the display screen 20. The first display surface 31 may include the first display area 21 and a portion of the foldable display area 23 covering the first section 133. The second display surface 41 may include the second display area 22 and another portion of the foldable display area 23 covering the second section 134.

Noted that the bending axis along which the electronic device is divided into the two parts may be any one of the one or more bending axes of the foldable portion 13. When the bending axis varies, an area of the first display surface 31 and an area of the second display surface 41 may also change.

As illustrated in FIGS. 3-5 in conjunction with FIG. 2, in the fully-closed state, the electronic device may be folded into two parts. The second part 40 may be an upper one and located on the first part 30 which may be a lower one. The foldable portion 13 may also be folded into two portions. The first section 133 may be a lower portion and the second section 134 may be an upper portion. The first display surface 31 and the second surface 41 may face each other and be substantially parallel to each other. The area of the first display surface 31 may be substantially equal to the area of the second display surface 41. It should be noted that, in this state, both the first display surface 31 and the second display surface 41 may be free of being exposed and not viewable to the user.

In detail, the foldable portion 13 may be folded along a first bending axis 135 such that the first housing portion 11 and the second housing portion 12 can be laminated together. In this state, a length of the second section 134 may be longer than a length of the first section 133. The length of the second section 134 and the length of the first section 133 may be along a direction perpendicular to the first bending axis 135. The second housing portion 12 may be in a first folded position relative to the first housing portion 11 such that the first end 111 of the first housing portion 11 may be flush with the second end 121 of the second housing portion 12. In other words, the electronic device may be folded in half when it is in the fully-closed state. For the display screen 20, the foldable display area 23 may also be folded to adapt to a folded shape of the foldable portion 13. The first display area 21 and the second display area 22 may be laminated together and sandwiched between the first housing portion 11 and the second housing portion 12.

A back face of the first housing portion 11 away from the display screen 20 and a back face of the second housing portion 12 away from the display screen 20 may be substantially parallel to each other, and the first display surface 31 and the second display surface 41 may also be substantially parallel to each other. As an example, edges of the housing assembly 10 may extend between the first display area 21 and the second display area 22 as a support such that the first display area 21 and the second display area 22 can be spaced apart from each other without a touch. In this way, the friction between the first display area 21 and the second display area 22 can be reduced, thereby protecting the display screen 20. As another example, the first display area 21 and the second display area 22 can be in contact with each other. In this way, a thickness of the electronic device in the fully-closed state can be reduced, thus improving the portability. In order to protect the display screen 20, a transparent protective film can be attached on the display screen 20.

The first display area 21 may be covered by the second housing portion 12, and the second display area 22 may be covered by the first housing portion 11 such that the entire display surface of the display screen 20 can be covered. In this way, when the electronic device is in the fully-closed state, the display screen 20 can be fully protected especially when the display screen 20 is glass based which is prone to breakage.

It should be noted that, when the electronic device is in the fully-closed state, the display screen 20 can be off or in a display-off state. When a short message or an incoming call is received, the electronic device can notify the user by at least one method of ringing, vibrating, and so on. In some embodiments, the electronic device may further include one or more indicator lights 50. The one or more indicator lights 50 can be arranged on the back face of the housing assembly 10. In the embodiment of the FIG. 5, a plurality of indicator lights 50 can be arranged on the back face of the second housing portion 12 away from the second display area 22 and closing to the second end 121. The plurality of indicator lights 50 can be configured to emit indicating light. In some cases, the electronic device can notify the user by at least one of ringing, vibrating, emitting indicating light, and so on.

In this way, when the electronic device is not needed by the user, it can be left in the fully-closed state, thereby being able to both save power and protect the display screen 20.

In related art, when the user wants to obtain information from the display screen 20, the electronic device can be unfolded through the foldable portion 13 so as to reveal the display screen 20. However, such an operation may require the user to operate with both hands, and it is often difficult to use the electronic device when the user is on the go and has difficulty operating with both hands.

To further help satisfy a user's desire for convenience to view the display screen 20 when the electronic device is folded inwardly, the electronic device can also be adjusted to expose a portion of the display screen 20 by a sliding motion and/or other behavior. In this way, the user can check information from the portion of the display screen 20 without unfolding the electronic device and exposing the whole of the display screen 20.

Figure 6:
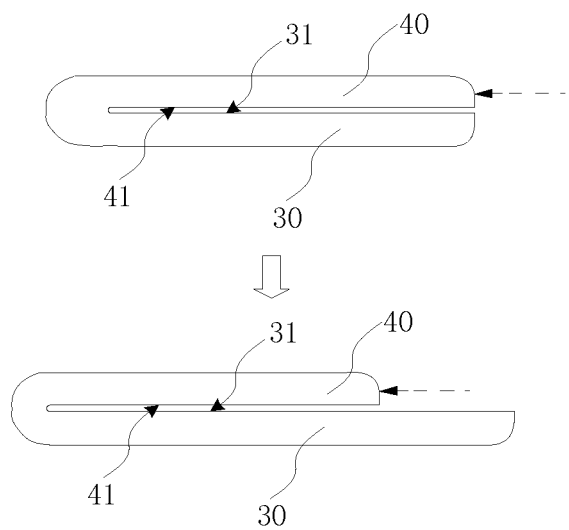
FIG. 6 is a schematic structural change view of an electronic device from the fully-closed state to a slide-open state according to an embodiment of the present disclosure.
Figure 7:
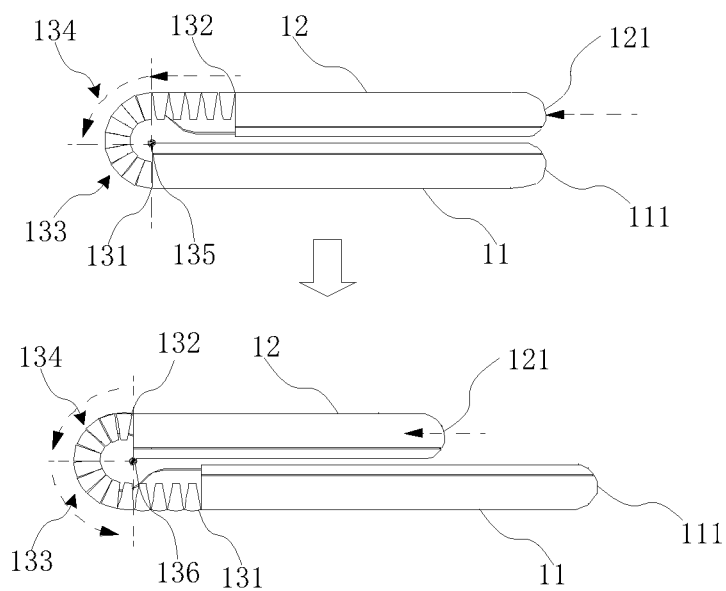
FIG. 7 is a schematic structural change view of an electronic device from the fully-closed state to a slide-open state according to another embodiment of the present disclosure.

In order to achieve the above purpose, as illustrated in FIGS. 6-7 in conjunction with FIG. 2, the second part 40 can be configured to slide relative to the first part 30 from a first state to a second state in a condition of the electronic device (may also be called as a foldable-slider device) being folded. In this way, a portion of the first display surface 31 can be exposed when the second part 40 is in the second state.

Specifically, in a condition of the foldable portion 13 being in a folded state and the electronic device being folded, the two opposite ends 131,132 of the foldable portion 13 may be configured to be slidable relative to each other, enabling the second housing portion 12 to slide towards the foldable portion 13 relative to the first housing portion 11, such that the first end 111 of the first housing portion 11 and the second end 121 of the second housing portion 12 may be staggered and a part of the display surface of the display screen 20 such as the shortcut display area 211 can be exposed.

As an embodiment, the foldable portion 13 may be a slider-pivot hinge mechanism, such as a variable radius hinge mechanism. The variable radius hinge may be a linear hinge or a geared hinge. As shown in FIGS. 6-7, the electronic device may be in a fully-closed state initially, the second housing portion 12 is in the first folded position, and the entire display face of the display screen 20 can be covered by the housing assembly 10. As an external force towards the foldable portion 13 is applied to the second end 121, the external force can be transmitted to the end 132 of the foldable portion 13 through the second housing portion 12, causing the foldable portion 13 to change radius such that the end 132 may slide relative to the end 131 along a direction of the external force, thereby driving the second housing portion 12 to slide relative to the first housing portion 11 in the direction of the external force, and the shortcut display area 211 can be gradually exposed from the second housing portion 12 until the second housing portion 12 arrives at a second folded position, at which the shortcut display area 211 may be completely exposed from the second housing portion 11 and the electronic device can be in a slide-open state.

When the electronic device is in the fully-closed state, the second housing portion 12 is at the first folded position, and the second part is in the first state. When the electronic device is in the slide-open state, the second housing portion 12 is at the second folded position, or the second part is in the second state.

It should be noted that, during the adjustment, the bending axis along which the electronic device may be unfolded into the two parts changes from the first bending axis 135 to a second bending axis 136, the area of the first display surface 31 of the first part 30 may gradually increase and the area of the second display surface 41 of the second part 40 may gradually decrease, the back face of the first housing portion 11 away from the display screen 20 may keep substantially parallel to the back face of the second housing portion 12 away from the display screen 20, and the first display surface 31 may also keep substantially parallel to the second display surface 42.

In some embodiments, the foldable portion 13 may be electrically controlled. In detail, a control instruction may be issued via a corresponding physical button of the electronic device, and the foldable portion 13 may be controlled in response to the control instruction such that the end 132 may slide relative to the end 131, thereby causing the second housing portion 12 to slide relative to the first housing portion 11. The control instruction may also be a voice instruction, a gesture instruction, and the like.

In addition, the electronic device may further include one or more locking mechanisms mounted to the housing assembly 10, such as a locking mechanism 60 (may also be called as a latch mechanism) depicted in FIG. 2. In the embodiment of FIG. 2, the locking mechanism 60 may be located at a side of the shortcut display area 211 closing to the foldable portion 13. The locking mechanism 60 can be configured to lock the second housing portion 12 at the second folded position such that the electronic device can keep in the slide-open state.

In a case, the locking mechanism 60 may be a magnetic lock and can achieve a locking function by magnetic adsorption. As an example, the locking mechanism 60 may be an electromagnetic lock.

In detail, when the second housing portion 12 reaches the second folded position, the locking mechanism 60 may be triggered and lock the second housing portion 12 at the second folded position to prevent a further sliding motion between the first housing portion 11 and the second housing portion 12 to a certain extent, so that the electronic device may keep in the slide-open state.

Figure 8:
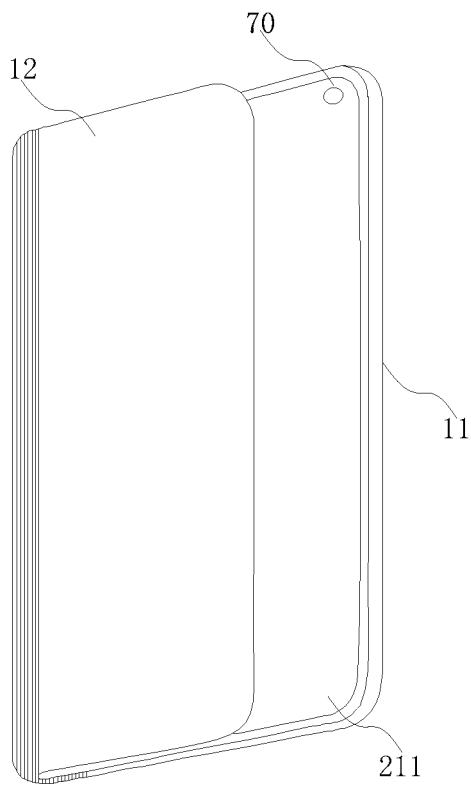
FIG. 8 is a schematic structural view of an electronic device according to an embodiment of the present disclosure under a slide-open state.
Figure 9:
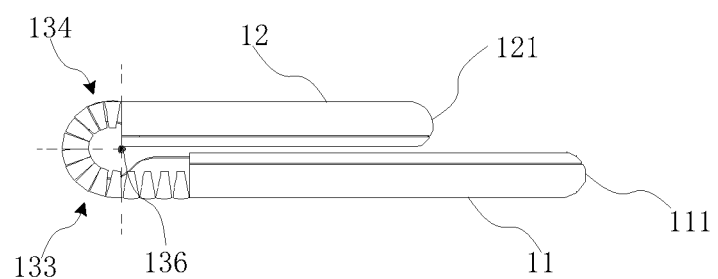
FIG. 9 is a schematic structural view of an electronic device according to another embodiment of the present disclosure under the slide-open state.
Figure 10:
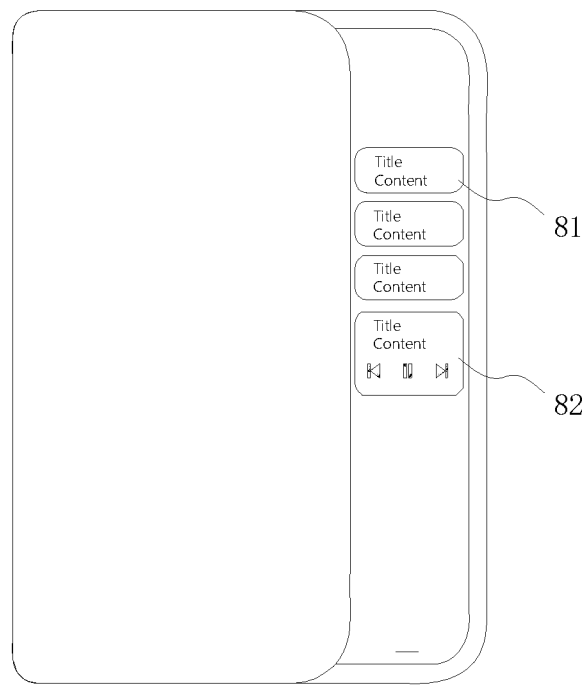
FIG. 10 is a schematic diagram of a display interface of an electronic device according to an embodiment of the present disclosure under the slide-open state.
Figure 11:
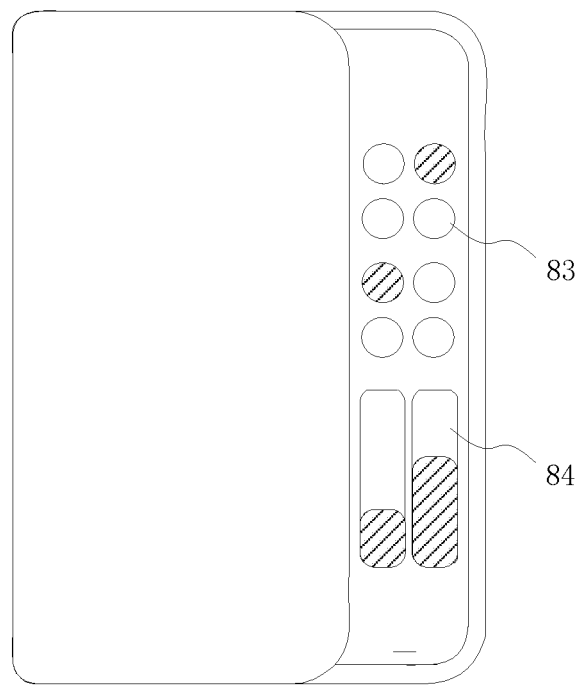
FIG. 11 is a schematic diagram of another display interface of an electronic device according to an embodiment of the present disclosure under the slide-open state.
Figure 12:
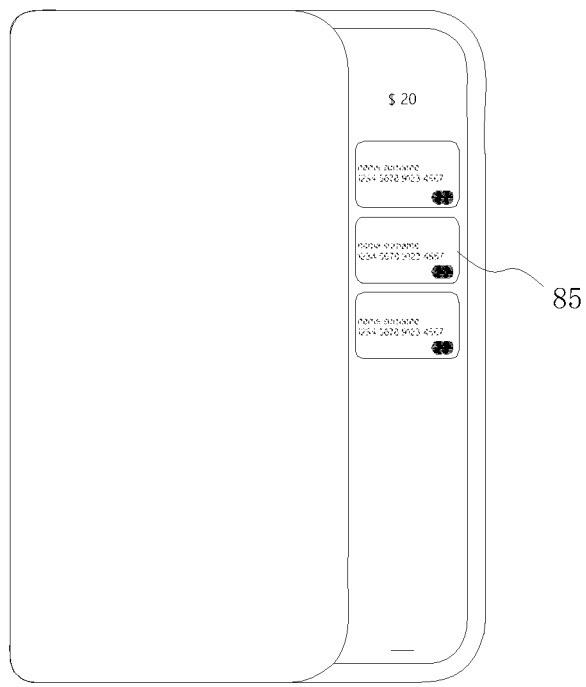
FIG. 12 is a schematic diagram of another display interface of an electronic device according to an embodiment of the present disclosure under the slide-open state.
Figure 13:
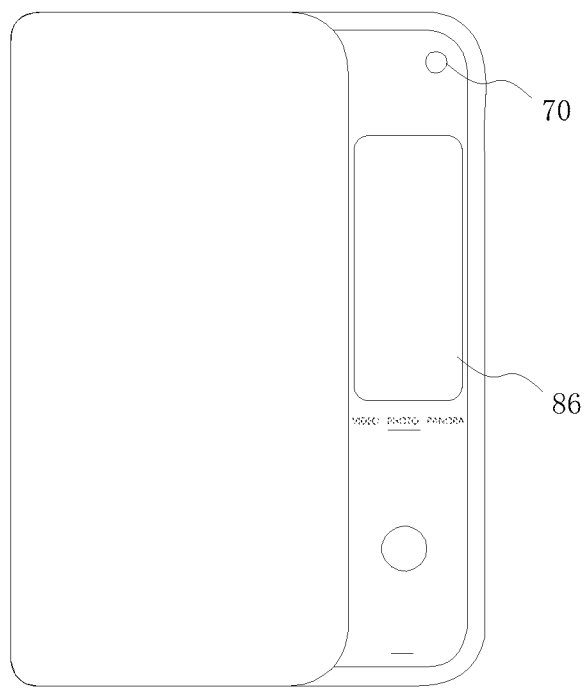
FIG. 13 is a schematic diagram of another display interface of an electronic device according to an embodiment of the present disclosure under the slide-open state.

As illustrated in FIGS. 8 and 9 in conjunction with FIG. 2, when in the slide-open state, the electronic device may still be folded, but not folded in half. The back face of the first housing portion 11 away from the display screen 20 and the back face of the second housing portion 12 away from the display screen 20 may still be substantially parallel to each other, and the first display area 21 and the second display area 22 may also still be substantially parallel to each other. The bending axis of the foldable portion 13 may be the second bending axis 136. The length of the second section 134 (the upper portion) of the foldable portion 13 may be shorter than that of the first section 133 (the lower portion) of the foldable portion 13. The second end 121 of the second housing portion 12 may be located at a side of the shortcut display area 211 away from the first end 111 of the first housing portion 11, such that the shortcut display area 211 may no longer be covered by the second housing portion 12.

The shortcut display area 211 may be a part of the first display area 21 and big enough for essential and key interactions. In a direction perpendicular to a sliding direction of the second housing portion 12, the shortcut display area 211 may have a same size as that of the first display area 21. Along the sliding direction, a size of the shortcut display area 211 may be ⅔, ½, ⅓, ¼, etc. of a size of the first display area 21. The shortcut display area 211 may have an elongated shape along the direction perpendicular to the sliding direction.

In addition, the electronic device may further include one or more cameras, such as the camera 70 in FIGS. 2 and 8. The camera 70 may be a front camera and connected to the first housing portion 11. The camera 70 may be located closing to the shortcut display area 211 and the first end 111 of and the first housing portion 11 such that when the second housing portion 12 is located at the second folded position, the camera 70 can also be exposed.

In some other embodiments, the electronic device may also include other components, such as an earpiece, a microphone, etc., positioned closing to the shortcut display area 211 and the first end 111, which can also be exposed when the electronic is in the slide-open state.

It should be noted that when the electronic device is in the fully-closed state, the second housing portion 12 may be at the first folded position and the display screen 20 may be in the display-off state. When the second housing portion 12 slides to the second folded position from the first folded position such that the shortcut display area 211 is exposed, a first data can be displayed on the shortcut display area 211. As a case, the shortcut display area 211 can be started to display the first data only when the second housing portion 12 arrives at the second folded position. As another case, when the second housing portion 12 begins to slide, causing the second end 121 moving away from the first end 111, the shortcut display area 211 can be activated and the first data can be displayed on an exposed portion. As an area of the exposed portion of the shortcut display area 211 increases, a display interface showing the first data on the shortcut display area 211 may gradually expand.

The first data can be basic functional data of the electronic device and essential or key for the user especially when the user is on the go. As illustrated in FIGS. 10-13, the first data may include at least one of a notification message 81 (can be seen in FIG. 10), an operating widget for media control 82 (can also be seen in FIG. 10), a setting panel 83 (can be seen in FIG. 11), an adjustment slider 84 (can also be seen in FIG. 11), an electronic payment interface 85 (can be seen in FIG. 12), and a photographing interface 86 (can be seen in FIG. 13).

In detail, the notification message may include at least one of a short message, an alert message for a missed call, and an alert message for other applications. When a new notification message is received by the electronic device, it can be presented on the shortcut display area 211 for the user to preview or view. The operating widget for media control can be used to perform control operations on medium, and may include virtual buttons for start, pause, end, previous song, next song, and so on. In a case, a corresponding control operation can be performed by clicking a corresponding virtual button. The setting panel can include at least one of the virtual buttons for flight mode, wireless network, bluetooth, do not disturb mode, personal hotspot, and the like. A corresponding mode can be turned on and off by clicking a corresponding virtual button. The adjustment slider may be at least one of a slider for adjusting brightness of the display screen 20 as well as a slider for adjusting volume of the electronic device. The brightness and volume can be adjusted by dragging a corresponding slider up or down. The electronic payment interface can be a payment interface for bank card, a payment interface for electronic payments with built in services, a payment interface for payment application, and can include a corresponding QR code, bar code, or the like. The photographing interface can be used for the camera 70, or one or more other cameras, and can include a photographing mode virtual button, a photographing preview screen, a photographing control virtual button, and the like. In addition, the first data may also include weather data, time data, date data, etc. The first data may be a default, or can be preset by the user according to an actual demand.

Figure 14:
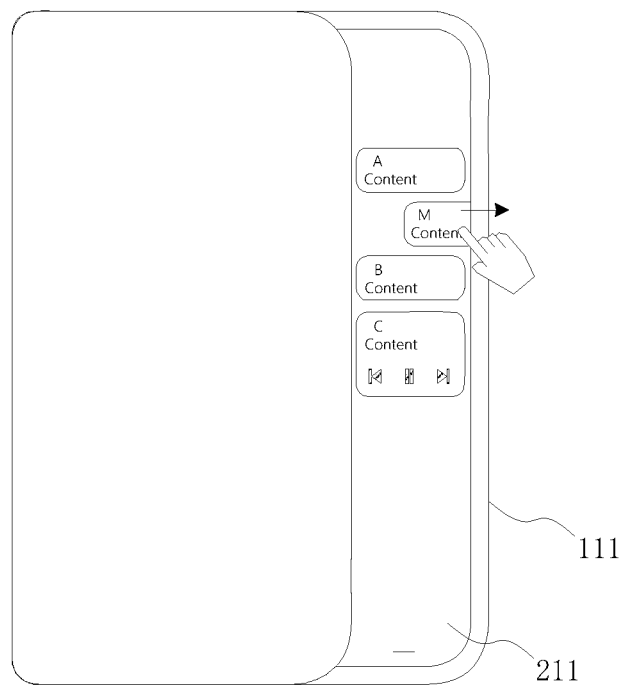
FIG. 14 is a schematic diagram of user's interaction with an electronic device according to an embodiment of the present disclosure under the slide-open state.
Figure 15:
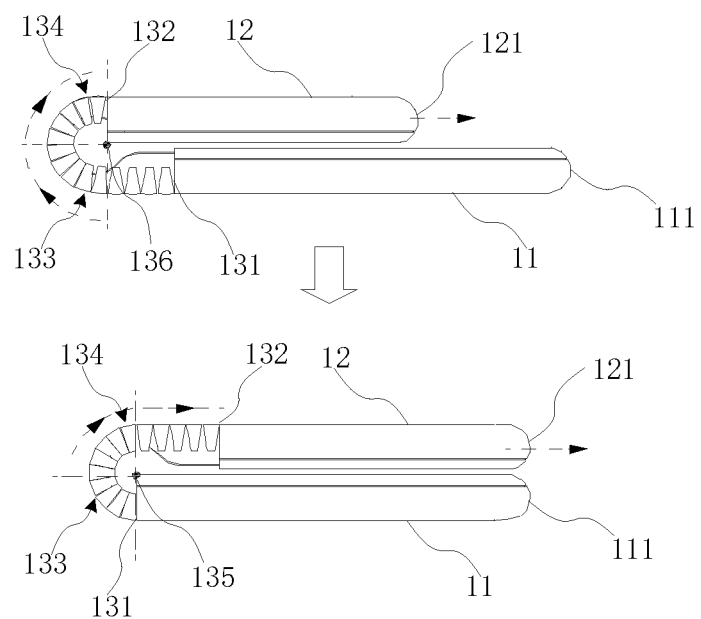
FIG. 15 is a schematic structural change view of an electronic device from the slide-open state to the fully-closed state according to an embodiment of the present disclosure.
Figure 16:
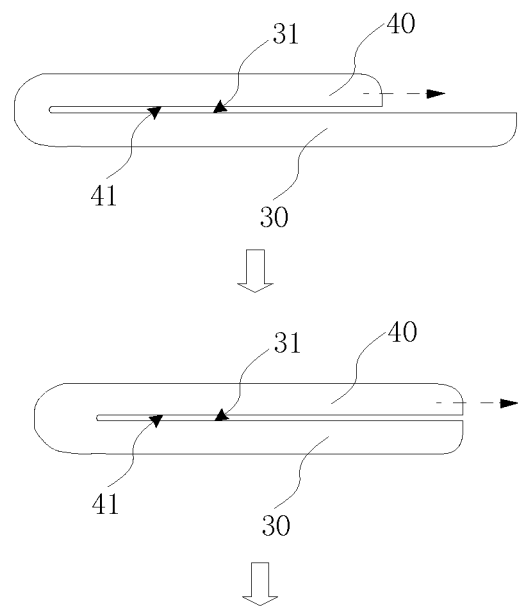
FIG. 16 is a schematic structural change view of an electronic device from the slide-open state to the fully-closed state according to another embodiment of the present disclosure.

In one embodiment, the first data can be removed from the shortcut display area 211 according to the user's actual requirements. In a case, the first data can be removed from the shortcut display area 211 in response to a swiping operation of the first data in a direction away from the foldable portion 13. For example, as illustrated in FIG. 14, a message M can be dragged in a direction towards the first end 111 of the first housing portion 11 and away from the foldable portion 13, thereby the message M being removed from the shortcut display area 211.

In these embodiments described above, the shortcut display area 211 can be exposed to display essential and key information by a sliding motion of the second housing portion 12. Since the sliding motion can be achieved by the user's pushing on the second housing portion 12, making an entry point into the electronic device faster and easier to be performed with one hand on the go. In addition, in related art, for ease of use without unfolding the foldable electronic devices, external displays and cameras are used to exhibit essential information similar to the first data or achieve key interactions, which imply increase on bill of materials and redundancies at system level. However, for the electronic device described in the above embodiments, the external displays and cameras may not be needed, since revealing the shortcut display area 211 that is big enough for key interactions, such as reading notifications, using quick replies, adjusting settings, accessing the camera 70 and performing payments on the go simplifies the user experience without unfolding the electronic device, resulting in reduced costs and redundancies at system level.

In an embodiment, with reference of FIGS. 2, 6-7 and 15-16, in the condition of the foldable portion 13 being in a folded state, the two opposite ends 131, 132 may be configured to be slidable relative to each other such that the second housing portion 12 may be enabled to slide between the first folded position and the second folded position. In other words, the second part 40 can slide relative to the first part 30 between the first state and the second state. In this way, after checking the information displayed on the shortcut display area 211, the user can pull the second housing portion 12 in a direction away from the foldable section 13 such that the second housing portion 12 may slide relative to the first housing portion 11 and return to the first folded position, causing the shortcut display area 211 and the camera 70 or other components located closing to the shortcut display area 211 being covered by the second housing portion 12. Then the display screen 20 may be off in response to the second housing portion 12 sliding back to the first folded position.

It should be noted that, during the adjustment to the electronic device from the slide-open state to the fully-closed state, the length of the first section 133 (lower portion) of the foldable portion 13 and the area of the first display surface 31 of the first part 30 may gradually decrease, the length of the second section 134 (upper portion) of the foldable portion 13 and the area of the second display surface 41 of the second part 40 may gradually increase.

Figure 17:
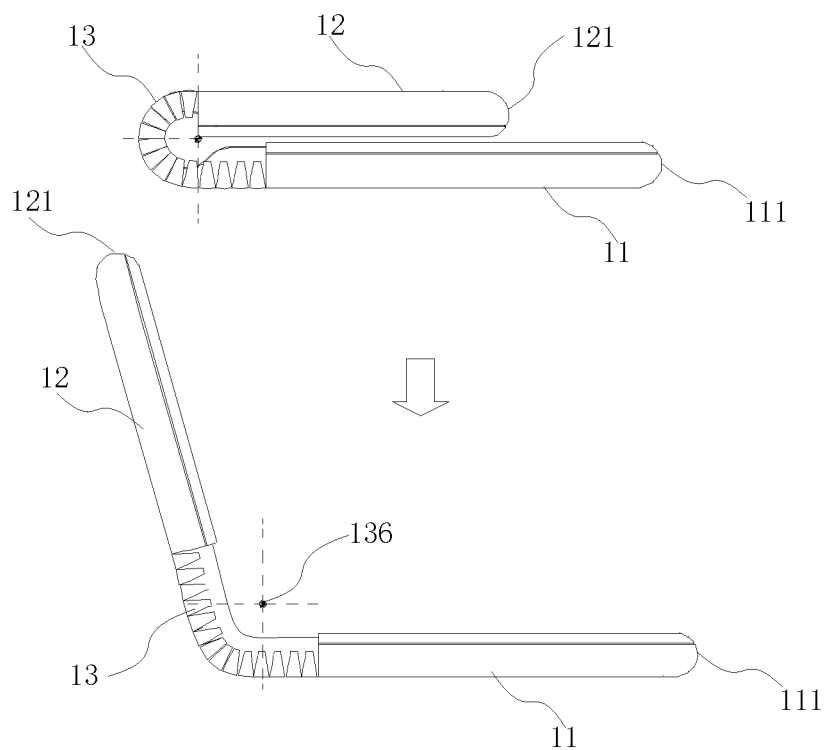
FIG. 17 is a schematic structural change view of an electronic device from the slide-open state to a half-open state according to an embodiment of the present disclosure.
Figure 18:
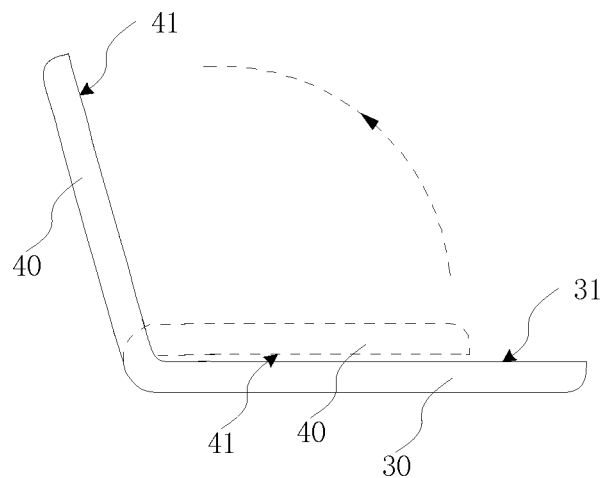
FIG. 18 is a schematic structural change view of an electronic device from the slide-open state to the half-open state according to another embodiment of the present disclosure.

Furthermore, in an embodiment, as illustrated in FIGS. 17-18, the foldable portion 13 may be configured to enable the second housing portion 12 to be unfolded relative to the first housing portion 11, thereby allowing a larger area of the display screen 20 to be exposed. In this way, when typing or more in depth application use is required, the second housing portion 12 can be unfolded from the second folded position to an unfolded position such as a half-unfolded position such that the electronic device can be in a half-open state.

In other words, the second part 40 may be configured to be capable of opening relative to the first part 30 by rotating the second part 40 around the foldable portion 13 to a third state such that the electronic device may be in the half-open state.

Specifically, the second housing portion 12 can be manually or automatically unfolded in one or more ways.

As described above, when the electronic device is in the slide-open state, the second housing portion 12 may be locked to the second folded position relative to the first housing portion 11 by the locking mechanism 60. The second housing portion 12 can be unfolded from the second folded position when released from the locking mechanism 60. Similarly, the second housing portion 12 can be released manually or automatically.

Figure 19:
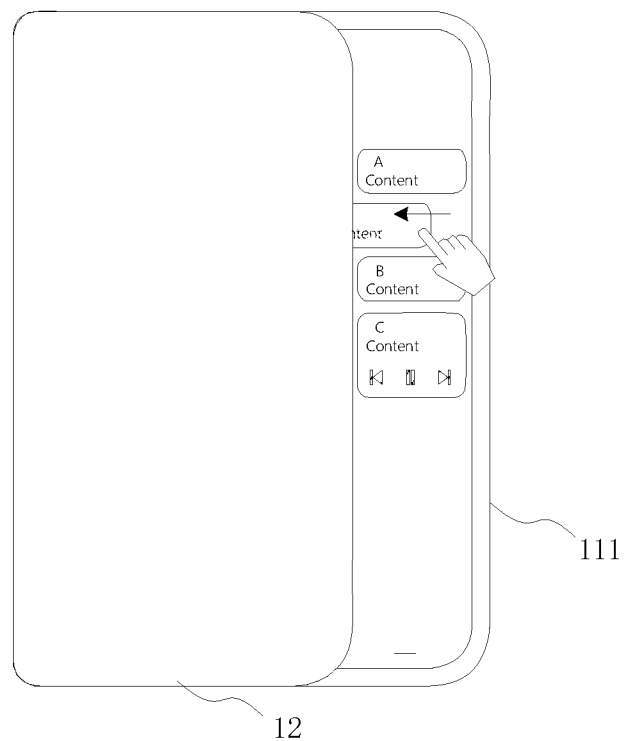
FIG. 19 is a schematic diagram of user's interaction with an electronic device according to an embodiment of the present disclosure under the slide-open state.

In an embodiment, the second housing portion 12 can be unlocked from the locking mechanism 60 in response to an unlocking instruction being received when the electronic device is in the slide-open state. Specifically, the unlocking instruction may be received in one or more ways. As a case, as depicted in FIG. 19, the unlocking instruction may be received in response to a certain first data (such as a notification message) on the shortcut display area 211 being dragged in the direction towards the foldable portion 13 and away from the first end 111. As another case, the unlocking instruction can also be received in response to a physical button on the housing assembly 10 or a virtual button displayed in the shortcut display area 211 being triggered.

Figure 20:
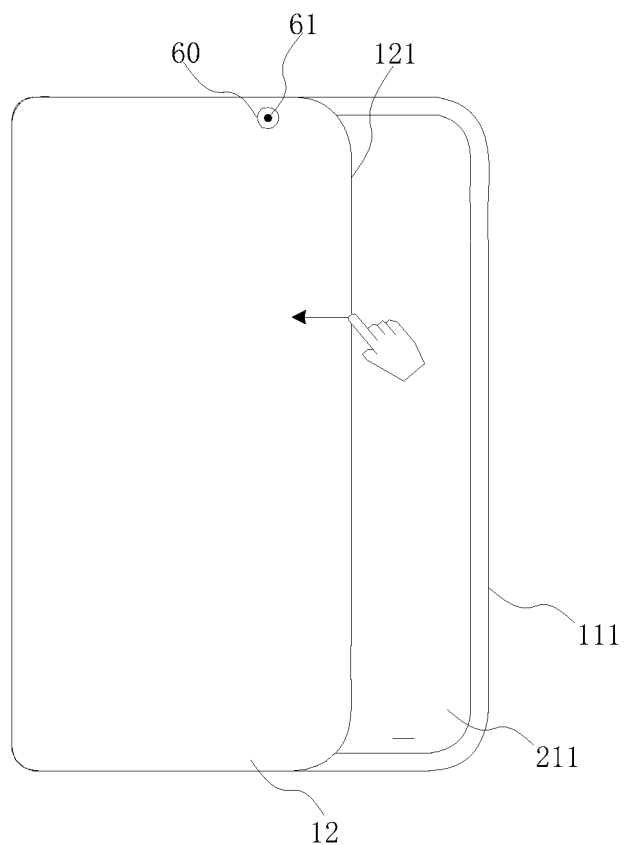
FIG. 20 is a schematic diagram of user's interaction with an electronic device according to another embodiment of the present disclosure under the slide-open state.

In another embodiment, as illustrated in FIG. 20, the locking mechanism 60 may define an unlocking point 61 (may also called as a de-latch point). The second housing portion 12 can also be released from the locking mechanism 60 by being pushed towards the foldable portion 13 and away from the first end 111 such that the second housing portion 12 can be beyond the unlocking point 61. Then the second housing portion 12 can be unfolded from the second folded position to the half-unfolded position. The second housing portion 12 sliding beyond the unlocking point 61 may mean the second end 121 of the second housing portion 12 sliding beyond the unlocking point 61, or a point of the second housing portion 12 corresponding to or covering the unlocking point 61 when the electronic device is in the slide-open state sliding beyond the unlocking point 61.

In these ways, the unfolding of the second housing portion 12 may allow the electronic device to be opened from the slide-open state to the half-open state through a one-hand operation, which can further simplify the user experience.

In another embodiment, when the electronic device is in the slide-open state, the user may manually apply a force to the second housing portion 12 in a direction away from the first housing portion 11 such that the second housing portion 12 can be directly unfolded relative to the first housing portion 11 about the second bending axis 136 without a sliding action.

Figure 21:
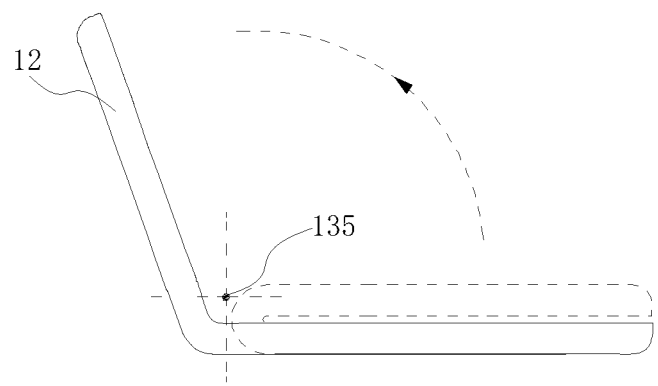
FIG. 21 is a schematic structural change view of an electronic device from the fully-closed state to the half-open state according to another embodiment of the present disclosure.

In addition, the electronic device can also be opened directly from the fully-closed state to the half-open state. As shown in FIG. 21, the second housing portion 12 can be unfolded directly from the first folded position to the half-unfolded position around the first bending axis 135. Specifically, the second housing portion 12 can also be manually or automatically unfolded.

In one embodiment, in response to a corresponding physical button arranged on the housing assembly 10 being triggered, the second housing portion 12 can be opened from the first folded position to the half-unfolded position around the first bending axis 135. In another embodiment, the user may manually apply a force to the second housing portion 12 in a direction away from the first housing portion 11 such that the second housing portion 12 may be directly unfolded relative to the first housing portion 11 around the first bending axis 135 without a sliding action.

Moreover, when the electronic device is in the fully-closed state or the slide-open state, the first display area 21 and the second display area 22 may be parallel to each other. A predetermined angle θ between the first display area 21 and the second display area 22 may approximately be 0°. As the second housing portion 12 is gradually unfolded relative to the first housing portion 11, the predetermined angle θ may gradually increase, and a distance between the first end 111 and the second end 121 may also gradually increase.

Figure 22:
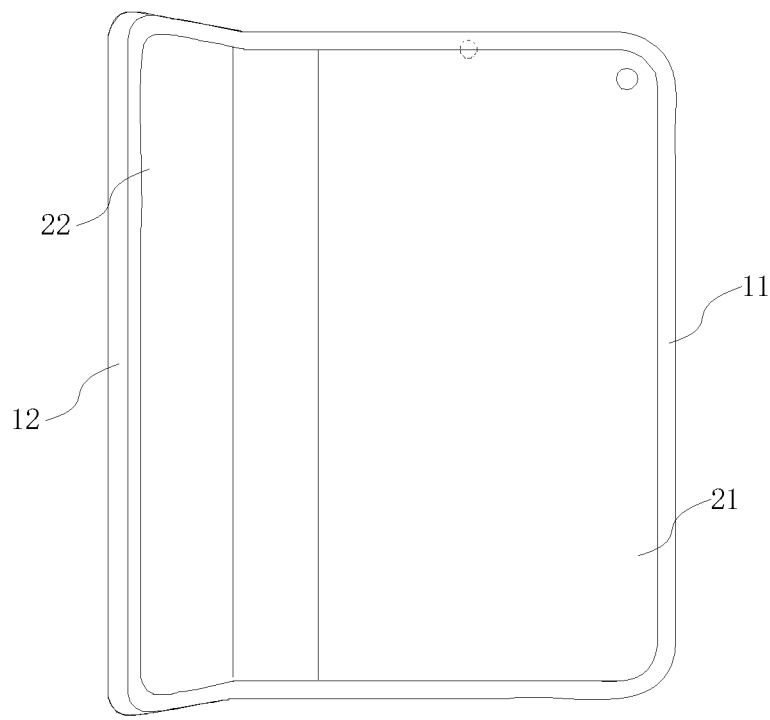
FIG. 22 is a schematic structural view of an electronic device according to an embodiment of the present disclosure under a half-open state.
Figure 23:
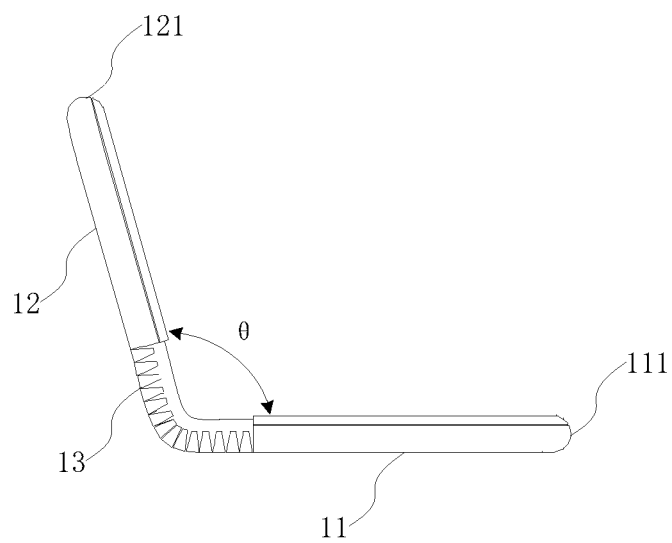
FIG. 23 is a schematic structural view of an electronic device according to another embodiment of the present disclosure under the half-open state.

In an embodiment, the foldable portion 13 may be configured to enable the second housing portion 12 to be relatively fixed at the half-unfolded position relative to the first housing portion 11. As illustrated in FIGS. 22-23, the electronic device may be in the half-open state. The predetermined angle θ between the first display area 21 and the second display area 22 may be greater than 0° and less than 180°. As a case, the predetermined angle θ can be greater than 60° and less than 150°. As another case, this predetermined angle can be greater than 90° less than 135°, such as 120°. The predetermined angle θ can be a system default or preset according to actual situation. In the case where the electronic device is manually adjusted to the half-open state by the user, the predetermined angle θ may be determined by a position at which the second housing portion 12 may be unfolded. It should be noted that the predetermined angle θ should be configured such that a vertical projection of the second housing portion 12 on a plane where the first display area 21 is located may not be overlapped with the first display area 21. In this way, the first display area 21 can be presented to the user without being obscured by the second housing portion 12.

In addition, the half-unfolded position may be any position of the second housing portion 12 during the second housing portion 12 being unfolded from the first folded position to a fully-unfolded position where the predetermined angle θ may be larger around the first bending axis 135, i.e., any position between the first folded position and the fully-unfolded position, and may also be any position of the second housing portion 12 during the second housing portion 12 being unfolded from the second folded position to the fully-unfolded position around the second bending axis 136, i.e., any position between the second folded position and the fully-unfolded position. Noted that, the half-unfolded position may not be the fully-unfolded position.

Figure 24:
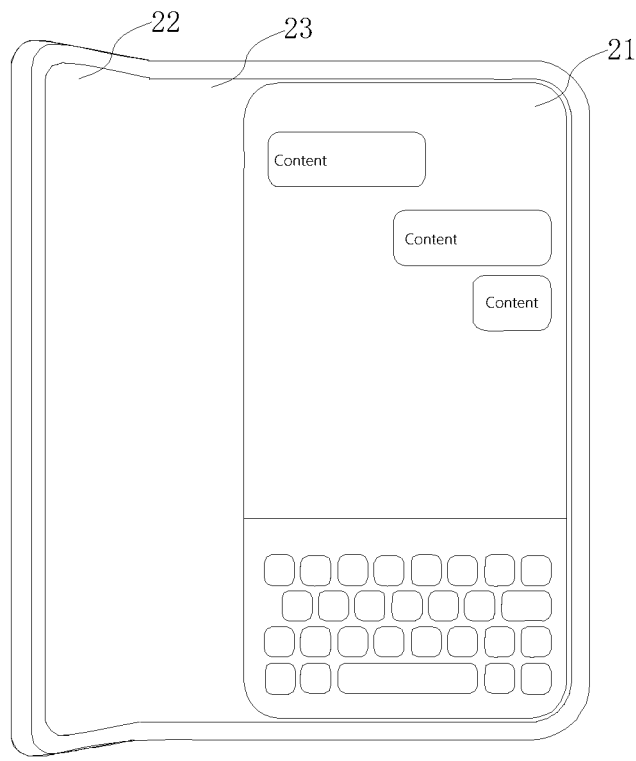
FIG. 24 is a schematic diagram of a display interface of an electronic device according to an embodiment of the present disclosure under the half-open state.

As illustrated in FIG. 24, when the electronic device is in the half-open state, a second data may be displayed on the first display area 21 of the display screen 20. The second data may include one or more of all functional data of the electronic device that the user can access, such as display interface or operation interface of each application. The second data may contain more data of the electronic device than the first data. It should be noted that, in this state, the second display area 22 and the foldable display area 23 may be off without having a display interface, and only the first display area 21 has a display interface. The second data can be displayed on the first display area 21 in response to the first display area 21 being exposed. Further, the first display area 21 can be exposed by moving the second housing portion 12 to the half-unfolded position from the first folded position or the second folded position.

During the electronic device being adjusted from the slide-open state to the half-open state, as the first display area 21 is gradually revealed, a display interface displaying the first data on the shortcut display area 211 of the display screen 20 may gradually expand until it occupies an entire first display area 21 and display the second data on the first display area 21. It should be noted that different data can be displayed on the first display area 21 in different cases.

Figure 25:
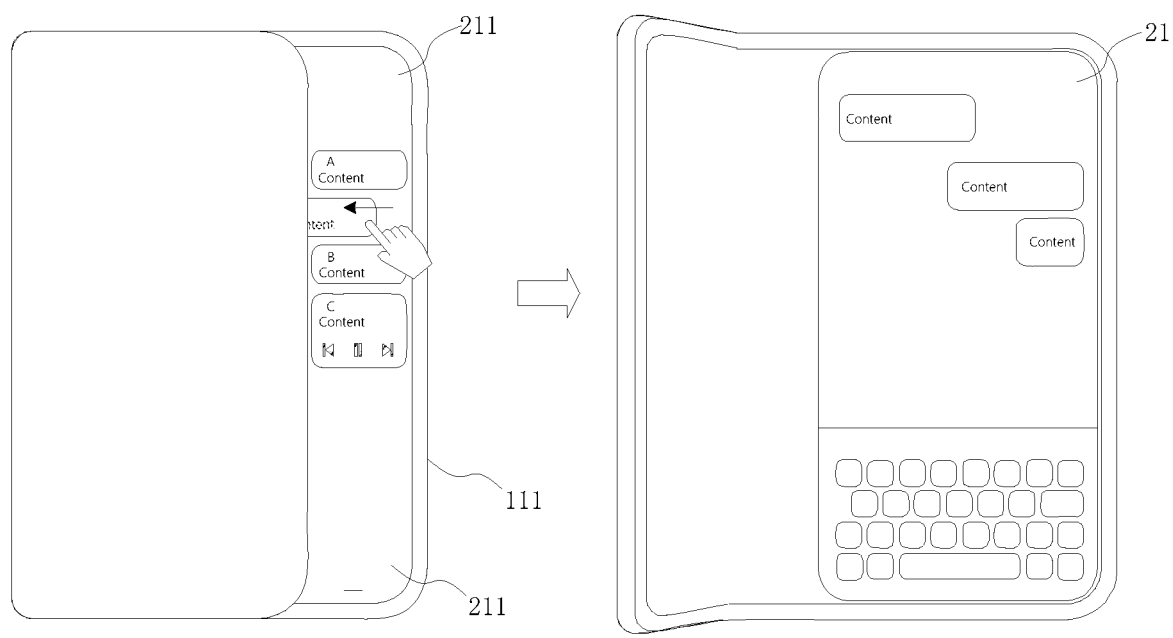
FIG. 25 is a schematic diagram of change on a display interface of an electronic device from the slide-open state to a half-unfolded state according to an embodiment of the present disclosure.

In one embodiment, during the electronic device being adjusted from the slide-open state to the half-open state with a certain first data selected or dragged, a display interface presenting the application corresponding to the selected or dragged first data can gradually expand until it occupies the entire first display area 21. As a case, the electronic device can be adjusted from the slide-open state to the half-open state in response to the first data being dragged towards the foldable portion 13, and an application corresponding to the dragged first data may gradually expand in a manner as described above. For example, as shown in FIG. 25, when a messaging notification displayed on the shortcut display area 211 is dragged in, it can be expended to a half-screen sized application displayed on the first display area 21, allowing full one-hand interaction, including for example the use of keyboard for typing. As another case, while a certain first data such as a widget is dragged and simultaneously the second housing portion 12 is pushed beyond the unlocking point 61, the application relative to the widget that was dragged may also expand in the manner as described above.

Figure 26:
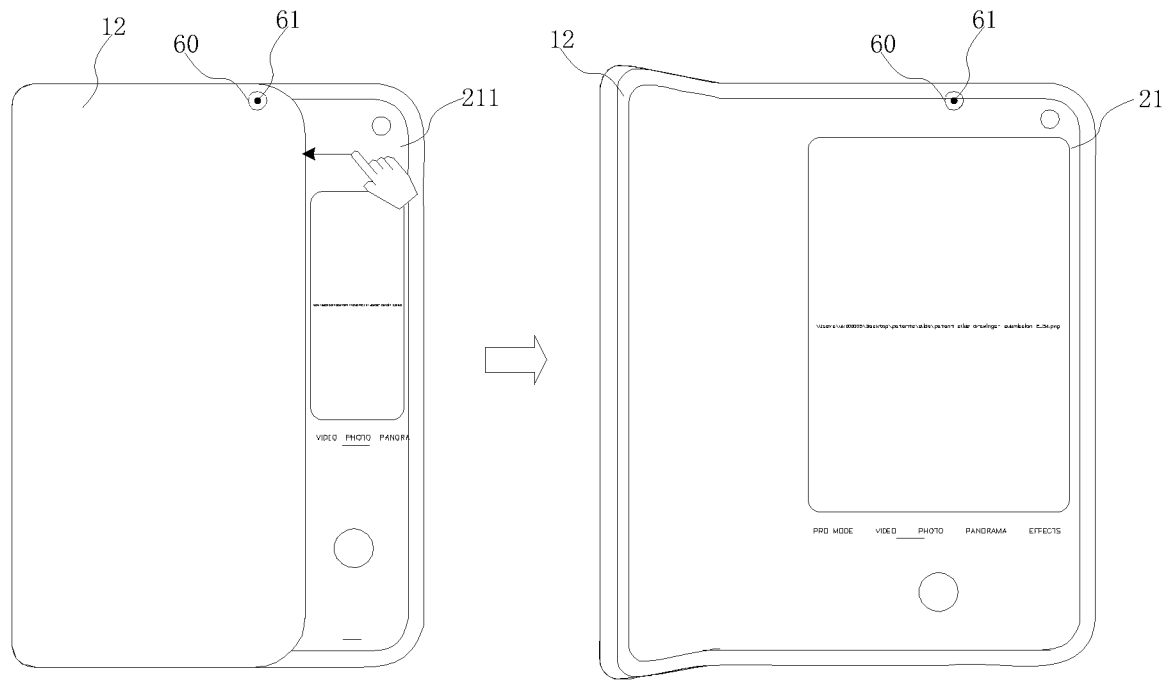
FIG. 26 is a schematic diagram of change on a display interface of an electronic device from the slide-open state to the half-unfolded state according to another embodiment of the present disclosure.

In another embodiment, during the electronic device being adjusted from the slide-open state to the half-open state without a certain first data being selected or dragged, a display interface for displaying the first data on the shortcut display area 211 can directly expand to an expanded display interface for displaying a second data on the entire first display area 21. It should be noted that the second data may have a correspondence with the first data. When the first data contains only one type of data, the second data can be a display interface or an operation interface of an application corresponding to the first data. For example, referring to FIG. 26, when the second housing portion 12 is manually pushed beyond the unlock point 61, a camera active in the shortcut display area 211 can gradually expand to occupy the first display area 21 in a wider format. When the first data contains two or more types of data (e.g., both notification messages and operating widgets for media control), the second data may contain the first data and may have a different arrangement compared to the first data.

In the above embodiments, the electronic device can be easily opened by the user from the slide-open state to the half-open state by a one-handed operation. Moreover, since the display of the electronic device in the half-open state is a half-screen display, and the size of the half-screen allows the user to continue interactions with the electronic device by means of one-handed operation, thereby bringing more convenience to use.

Figure 27:
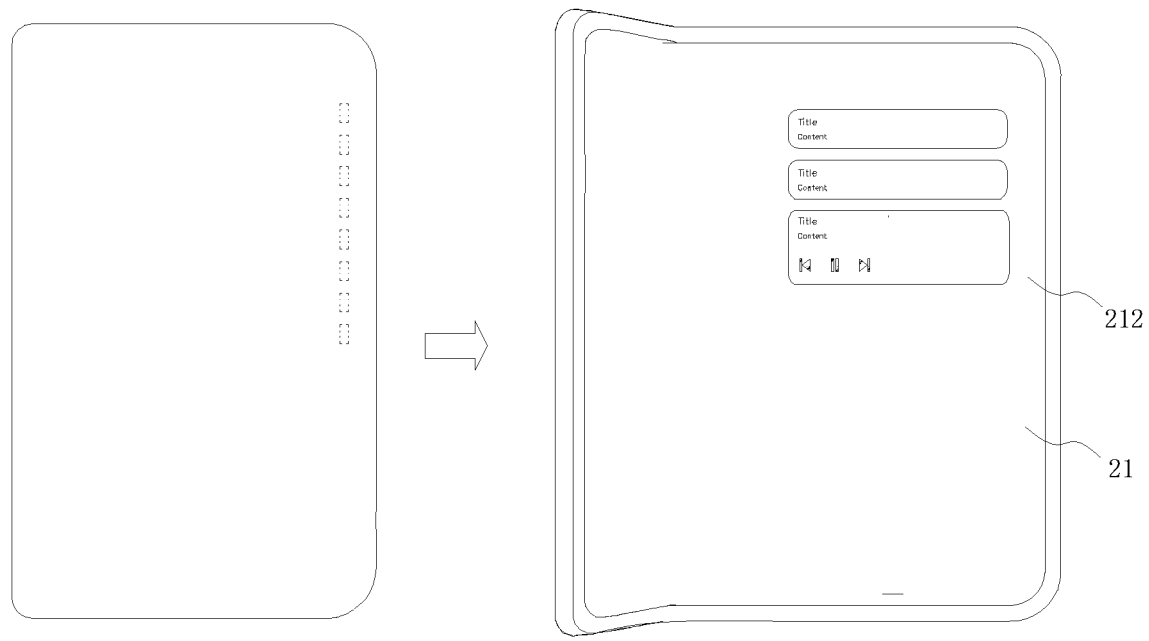
FIG. 27 is a schematic diagram of change on a display interface of an electronic device from the slide-open state to the half-unfolded state according to another embodiment of the present disclosure.
Figure 28:
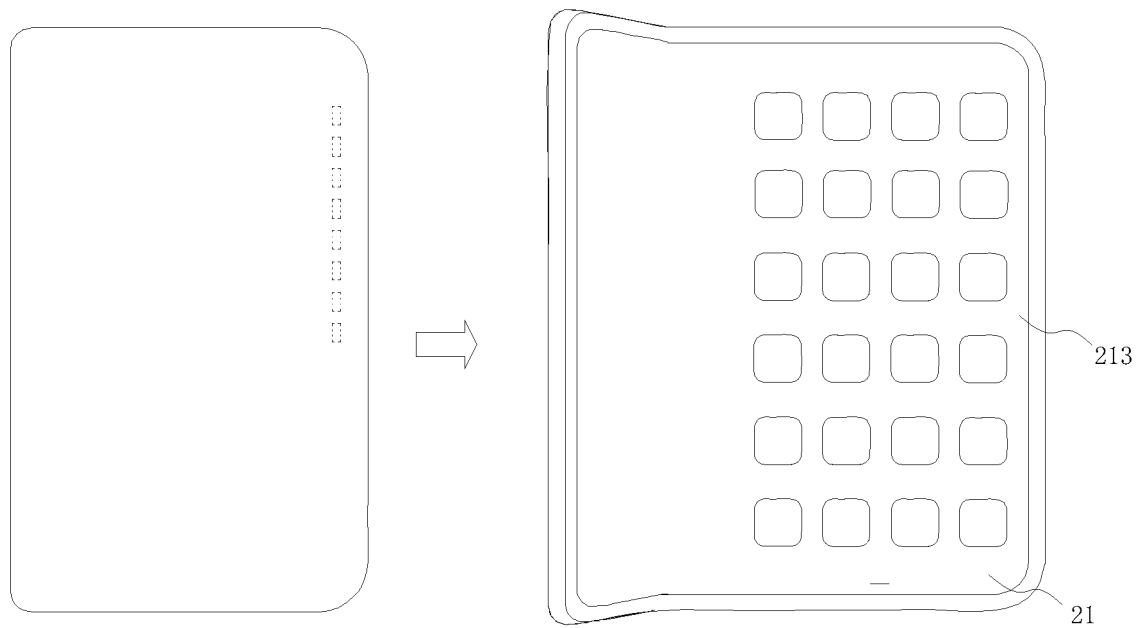
FIG. 28 is a schematic diagram of change on a display interface of an electronic device from the slide-open state to the half-unfolded state according to another embodiment of the present disclosure.

With continued reference to FIG. 21, the electronic device can also be adjusted directly from the fully-closed state to the half-open state without transitioning through the slide-open state. As described above, when the electronic device is in the fully-closed state, the display screen 20 may be in a display-off state without displaying any data. In this embodiment, as shown in FIGS. 27 and 28, the second data can be a locked interface 212 or a home interface 213. The locked interface 212 or the home interface 213 can be displayed on the first display area 21 replacing the display-off state of the display screen 20 in response to the second housing portion 12 being unfolded directly from the first folded position to the half-unfolded position. As a case, during the second housing portion 12 being unfolded, as the first display area 21 is exposed gradually, a display interface for displaying the locked interface 212 or the home interface 213 on the display screen 20 may gradually expand until the display interface occupies the whole first display area 21. As another case, the first display area 21 may keep the display-off state until the second housing portion 12 arrives at the half-unfolded position. In some other embodiments, the second data can be preset to other data, such as an operation interface of a certain application, by the user according to actual demands.

Figure 29:
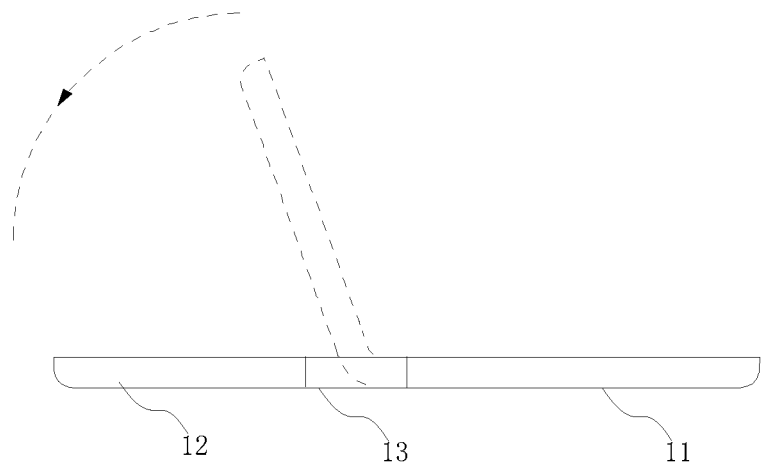
FIG. 29 is a schematic structural change view of an electronic device from the half-open state to a fully-unfolded state according to an embodiment of the present disclosure.

To satisfy user's desire for a larger screen display, the electronic device can also be adjusted to the fully-open state. As illustrated in FIG. 29, the foldable portion 13 can be configured to enable the second housing portion 12 to be unfolded from the half-unfolded position to a fully-unfolded position and relatively fixed at the fully-unfolded position such that the electronic device can in a fully-open state. Specifically, the electronic device can be manually or automatically adjusted.

In one embodiment, in a condition of the electronic device being in the half-open state, the foldable portion 13 can be controlled to be further unfolded until it is flattened in response to a control instruction received. The control instruction may be generated by a corresponding physical or virtual button being triggered, or it may be a voice instruction, a gesture instruction, and the like.

In another embodiment, the second housing portion 12 can be manually pushed by the user in a direction further away from the first housing portion 11 such that the second housing portion 12 can be unfolded around a bending axis of the foldable portion 13 until it reaches the fully-unfolded position.

Except for being adjusted from the half-open state to the fully-open state, the electronic device can also be manually or automatically adjusted from the slide-open state or the fully-closed state.

Figure 30:
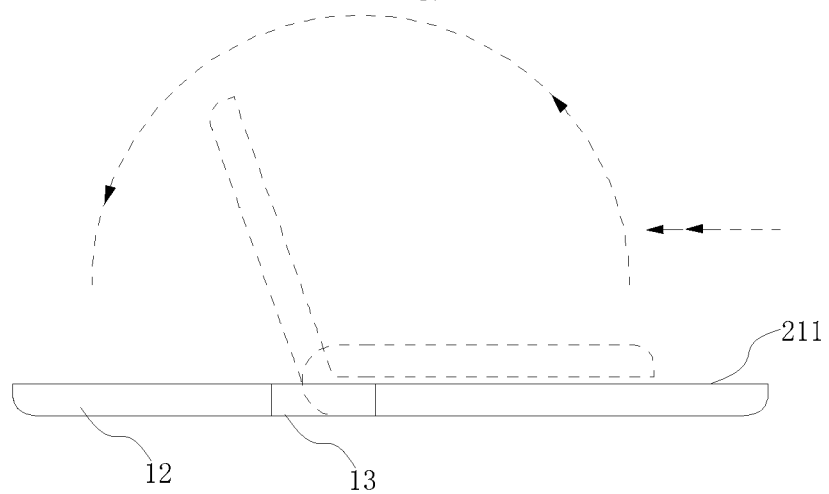
FIG. 30 is a schematic structural change view of an electronic device from the slide-open state to the fully-unfolded state according to an embodiment of the present disclosure.

In an embodiment, as illustrated in FIG. 30, a method of the adjustment of the electronic device from the slide-open state to the fully-open state can be the same as a method of the adjustment of the electronic device from the slide-open state to the half-open state. As a case, the electronic device can be unfolded to the fully-open state in response to a certain first data displayed on the shortcut display area 211 being dragged towards the foldable portion 13. As another case, the electronic device can be unfolded to the fully-open state in response to the second housing portion 12 being pushed beyond the unlocking point. As another case, the second housing portion 12 can be manually unfolded relative to the first housing portion 11 to the fully-unfolded position by the user, such that the electronic device can be adjusted to the fully-open state.

Note that for the first two cases described above, since the second housing portion 12 is unfolded automatically, a final state can be preset to be either the half-open state or the fully-open state. If it is the half-open state, the second housing portion 12 can be further manually moved by the user to the fully-unfolded position.

Figure 31:
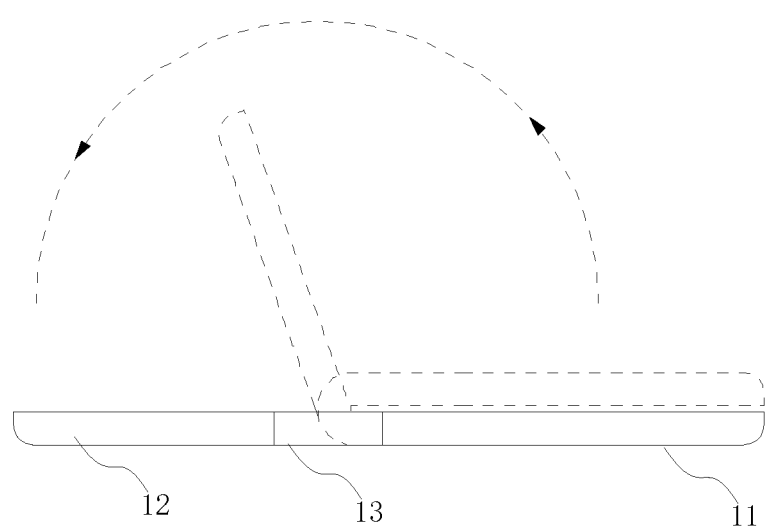
FIG. 31 is a schematic structural change view of an electronic device from the fully-closed state to the fully-unfolded state according to an embodiment of the present disclosure.

As illustrated in FIG. 31, in the embodiment that the electronic device being unfolded from the fully-closed state to the fully-open state, as a case, the second housing portion 12 can be manually unfolded relative to the first housing portion 11 from the first folded position to the fully-unfolded position by the user, such that the electronic device can be adjusted to the fully-open state. As another case, the foldable portion 13 can be controlled to be further unfolded until it is flattened in response to a control instruction received by the electronic device. The control instruction may be generated by a corresponding physical or virtual button being triggered, or it may be a voice instruction, a gesture instruction, and the like.

Figure 32:
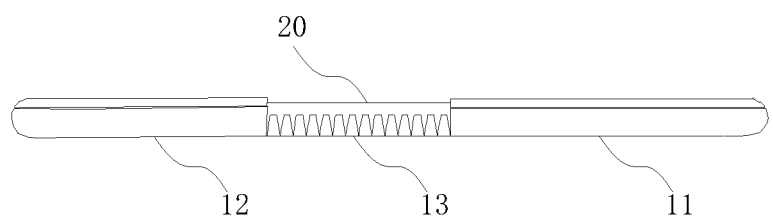
FIG. 32 is a schematic structural view of an electronic device according to an embodiment of the present disclosure under a fully-open state.

FIGS. 1-2 and 32 illustrate the electronic device in the fully-open state. When the electronic device is in this state, a degree of the predetermined angle θ between the first display area 21 and the second display area 22 may be greater than the degree when the electronic device in the fully-open state. In a case, the predetermined angle θ may be greater than 120° and not greater than 180°. In another case, the predetermined angle θ may be greater than 150° and not greater than 180°. In another case, the predetermined angle θ may be 180°. In other words, the first display area 21, the foldable display area 23, and the second display area 22 may cooperatively form a plane. In addition, the foldable portion 13 may also be unfolded substantially flat. The back face of the housing assembly 10 may also substantially be a plane. In a case, an entire back face of the housing assembly 10 may be substantially parallel to the entire display surface of the display screen 20. Moreover, the distance between the first end 111 and the second end 211 may be the greater than that between when the electronic device is in each of the other three states.

Figure 33:
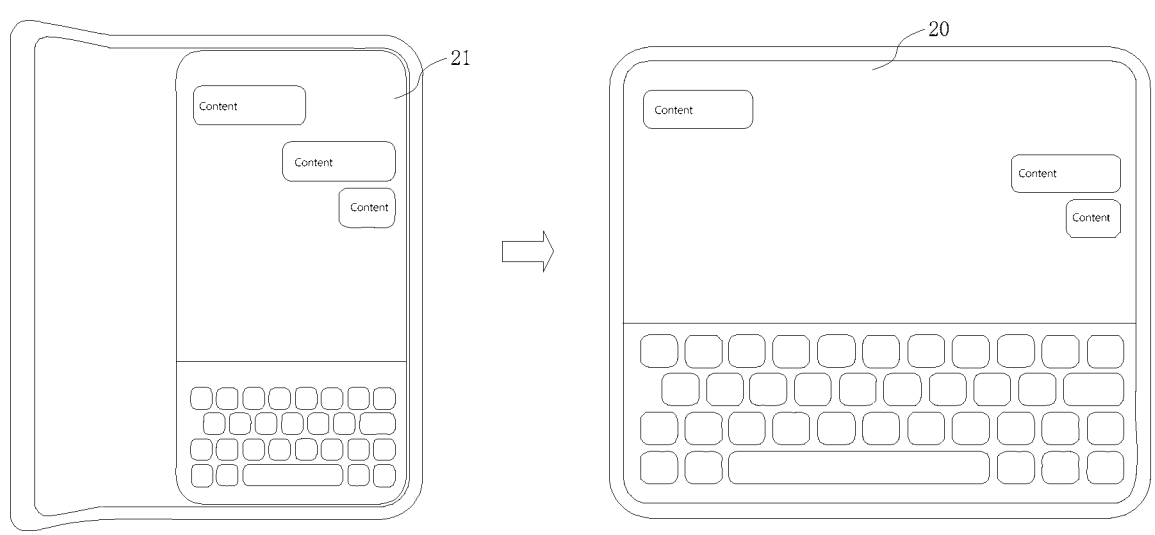
FIG. 33 is a schematic diagram of change on a display interface of an electronic device from the half-open state to the fully-unfolded state according to an embodiment of the present disclosure.

As shown in FIG. 33 in conjunction with FIG. 2, when the electronic device is in the half-open state, the second data can be displayed on the first display area 21 in a half-screen mode. A display interface for displaying the second data on the first display area 21 can expand to another display interface for displaying the third data on the whole display screen 20 in a full-screen mode in response to the second housing portion 12 being unfolded from the half-unfolded position to the fully-unfolded position. In this way, an area of the display interface of the display screen 20 can further expand, enriching user experience.

Specifically, the display interface of the display screen 20 can be changed in one or more ways. In a case, as the second housing portion 12 is gradually unfolded relative to the first housing portion 13, the display interface can gradually expand until it occupies the entire display screen 20 when the second housing portion 12 reaches the fully-unfolded position. In another case, the display interface of the display screen 20 may not expand until the second housing portion 12 reaches the fully-unfolded position.

It should be noted that the third data may have a correspondence with the second data. In a case, the first data and the second data may correspond to a same application. However, the second data may have a different arrangement compared to the first data. For example, as shown in FIG. 33, during the process of the second housing portion 12 unfolded from the half-unfolded position to the fully-unfolded position, a messaging application open in half-open state with a keyboard in one hand operation size can expand to a full-screen mode application, including a full-screen keyboard.

With continued reference of FIGS. 2 and 10-13, when the electronic device is in the slide-open state, the first data can be displayed on the shortcut display area 211. During electronic device being unfolded from the slide-open state to the fully-open state, a display interface for displaying the first data on the shortcut display area 211 can expand to another display interface for displaying the third data in the full-screen mode in response to the second housing portion 12 being unfolded from the second folded position to the fully-unfolded position. In a case, as the display screen 20 is revealed gradually, the display interface of the display screen 20 can expand first to a half-screen size and then to a full-screen size. As another case, as the display screen 20 is revealed gradually, the display interface of the display screen 20 can expand directly to the full-screen size without transitioning the half-screen size.

It should be noted that different data can be displayed on the display screen 20 in different cases when the second housing portion 12 reaches the fully-unfolded position, which can be determined by whether a certain first data is selected or dragged or not during the adjustment of the electronic device from the slide-open state to the fully-open state. This is similar to the display of the electronic device when the electronic device is adjusted from the slide-open state to the half-open state and is not repeated here.

In addition, the third data may have a correspondence with the first data, which is also similar to the correspondence between the first data and the second data. The difference is that the second data and the third data may be arranged differently. The third data may be arranged in a full-screen display, and the second data may be arranged in a half-screen display.

In an embodiment, with continued reference of FIG. 2, the electronic device can be adjusted from the fully-closed state to the fully-open state. In this embodiment, the third data can be a locked interface or a home interface. The locked interface or the home interface can be displayed on the entire display screen 20 in the full-screen mode replacing the display-off state of the display screen 20 in response to the second housing portion 12 being unfolded directly from the first folded position to the fully-unfolded position. As a case, during the second housing portion 12 being unfolded, as the display screen 20 is exposed gradually, a display interface for displaying the locked interface or the home interface on the display screen 20 may gradually expand until the display interface occupies the whole display screen 20. As another case, the display screen 20 may keep the display-off state until the second housing portion 12 arrives at the fully-unfolded position. In some other embodiments, the second data can be preset to other data, such as an operation interface of a certain application by the user according to actual demands.

In addition, the foldable portion 13 can further be configured to enable the second housing portion to be folded from the fully-unfolded position to the half-unfolded position, or the second folded position, or the first folded position. In this way, the electronic device can also be adjusted to the fully-closed state manually or automatically to leave the display screen 20 being covered and in the display-off state.

The embodiments of the present disclosure have been described in detail above, and the principles and implementations of the present disclosure are described in the specific examples. The description of the above implementations is only used to help understand the method and core spirit of the present disclosure. In the meantime, one with ordinary skills in the art may obtain modifications on the specific embodiments and the application range according to the spirit of the present disclosure. In a word, the description shall not be considered as a limit to the present disclosure.

What is claimed is:

1. An electronic device, comprising:
   a housing assembly, comprising:
      a first housing portion and a second housing portion spaced from each other; and
      a foldable portion, comprising two opposite ends, wherein one end of the two opposite ends is connected to the first housing portion, the other end of the two opposite ends is connected to the second housing portion; and
   a display screen, connected to the housing assembly, covering the first housing portion, the second housing portion, and the foldable portion and having a shortcut display area covering a part of the first housing portion away from the foldable portion;
   wherein in a condition of the foldable portion being in a folded state, the two opposite ends are configured to be slidable relative to each other such that the second housing portion is enabled to slide between a first folded position where the shortcut display area is covered by the second housing portion and a second folded position where the shortcut display area is exposed from the second housing portion.

2. The electronic device as claimed in claim 1, further comprising:
   a locking mechanism, located at a side of the shortcut display area closing to the foldable portion and configured to lock the second housing portion at the second folded position when second housing portion is moved to the second folded position.

3. The electronic device as claimed in claim 1, further comprising:
   a camera, connected to the first housing portion and located closing to the shortcut display area;
   wherein when the second housing portion is located at the first folded position, the camera is covered by the second housing portion; when the second housing portion is located at the second folded position, the camera is exposed from the second housing portion.

4. The electronic device as claimed in claim 1, wherein the first housing portion comprises a first end away from the foldable portion, the second housing portion comprises a second end away from the foldable portion;
   wherein in a condition of the second housing portion being located at the first folded position, the first end is flush with the second end; in a condition of the second housing portion being located at the second folded position, the first end is located at a side of the shortcut display area away from the second end.

5. The electronic device as claimed in claim 4, wherein the display screen has:
   a first display area, covering the first housing portion, wherein the shortcut display area is a part of the first display area and adjacent to the first end;
   a second display area, covering the second housing portion; and
   a foldable display area, connected between the first display area and the second display area and covering the foldable portion;
   wherein in the condition of the second housing portion being located at the first folded position, the first display area is covered by the second housing portion, and the second display area is covered by the first housing portion.

6. The electronic device as claimed in claim 5, wherein the foldable portion is configured to enable the second housing portion to move between one of the first folded position and the second folded position and a fully-unfolded position where the second housing portion is fully-unfolded relative to the first housing portion;
   in a condition of the second housing portion being located at the fully-unfolded position, the first display area, the foldable display area, and the second display area cooperatively form a plane.

7. The electronic device as claimed in claim 6, wherein the foldable portion is configured to enable the second housing portion to be relatively fixed at a half-unfolded position between one of the first folded position and the second folded position and the fully-unfolded position;
   in a condition of the second housing portion being located at the half-unfolded position, the first display area and the second display area form a predetermined angle greater than 0° degree and less than 180°.

8. A method for displaying information for an electronic device, wherein the electronic device comprises a housing assembly and a display screen, the housing assembly comprises a first housing portion, a second housing portion, and a foldable portion comprising two opposite ends, one end of the two opposite ends is connected to the first housing portion, the other end of the two opposite ends is connected to the second housing portion, the display screen covers the first housing portion, the second housing portion, and the foldable portion and has a shortcut display area covering a part of the first housing portion away from the foldable portion, wherein in a condition of the foldable portion being in a folded state, the two opposite ends are configured to be slidable relative to each other such that the second housing portion is enabled to slide between a first folded position where the shortcut display area is covered by the second housing portion and a second folded position where the shortcut display area is exposed from the second housing portion, the method comprising:
   displaying a first data on the shortcut display area in response to the second housing portion sliding to the second folded position from the first folded position.

9. The method as claimed in claim 8, wherein the electronic device further comprises a camera, the method further comprises:
   starting the camera and displaying a photographing interface on the shortcut display area in response to the second housing portion sliding to the second folded position from the first folded position;

wherein the electronic device further comprises a locking mechanism, the method further comprises:
  locking the second housing portion at the second folded position by the locking mechanism in response to the second housing portion sliding to the second folded position from the first folded position.

10. The method as claimed in claim 8, the first data is removed from the shortcut display area in response to a swiping operation of the first data in a direction away from the foldable portion.

11. The method as claimed in claim 8, wherein the display screen further has a first display area covering the first housing portion, the shortcut display area is a part of the first display area, a size of the shortcut display area is smaller than a size of the first display area, the method further comprises:
  displaying a second data on the first display area in response to the first display area being exposed by moving the second housing portion to a half-unfolded position;
  wherein the second data is one of a locked interface and a home interface;
  the one of the locked interface and the home interface is displayed on the first display area replacing a display-off state of the display screen in response to the second housing portion being unfolded from the first folded position to the half-unfolded position.

12. The method as claimed in claim 11, wherein a display interface for displaying the first data on the shortcut display area expands to another display interface for displaying the second data on the first display area in response to the second housing portion being unfolded from the second folded position to the half-unfolded position;
  wherein the second data has a correspondence with the first data;
  wherein the method further comprises:
  unlocking the second housing portion and unfolding the second housing portion from the second folded position to the half-unfolded position in response to an unlocking instruction being received;
  wherein the unlocking instruction is received in response to an operation of swiping the first data in a direction towards the foldable portion.

13. The method as claimed in claim 12, wherein the locking mechanism defines an unlocking point at a side of the shortcut display area closing to the foldable portion, the method further comprises:
  unlocking the second housing portion and unfolding the second housing portion from the second folded position to the half-unfolded position in response to the second housing portion siding beyond the unlocking point from the second folded position.

14. The method as claimed in claim 11, wherein the display screen further has a second display area covering the second housing portion and a foldable display area covering the foldable portion and connected between the first display area and the second display area, when the second housing portion is located at a fully-unfolded position, the first display area, the foldable display area and the second display area cooperatively form a plane, the method further comprises:
  displaying a third data in a full-screen mode on the first display area, the second display area and the foldable display area in response to the second housing portion being unfolded to the fully-unfolded position;
  wherein the third data is one of a locked interface and a home interface;
  one of the locked interface and the home interface is displayed in the full-screen mode replacing a display-off state of the display screen in response to the second housing portion being unfolded to the fully-unfolded position from the first folded position.

15. The method as claimed in claim 14, wherein a display interface for displaying the first data on the shortcut display area expands to another display interface for displaying the third data in the full-screen mode in response to the second housing portion being unfolded from the second folded position to the fully-unfolded position;
  wherein the third data has a correspondence with the first data;
  wherein a display interface for displaying the second data on the first display area expands to another display interface for displaying the third data in the full-screen mode in response to the second housing portion being unfolded from the half-unfolded position to the fully-unfolded position;
  wherein the third data has a correspondence with the second data.

16. The method as claimed in claim 8, further comprising:
  turning off the display screen in response to the second housing portion being moved to the first folded position.

17. A foldable-slider device comprising:
  a first part having a first display surface; and
  a second part connected with the first part and having a second display surface;
  wherein the second part is configured to slide relative to the first part between a first state and a second state in a condition of the device being folded;
  wherein an area of the first display surface of the first part gradually increases and an area of the second display surface of the second part gradually decreases in response to a slide of the second part from the first state to the second state;
  wherein the area of the first display surface of the first part gradually decreases and the area of the second display surface of the second part gradually increases in response to a slide of the second part from the second state to the first state.

18. The foldable-slider device as claimed in claim 17, wherein the second part is located on the first part in the condition of the device being folded;
  the first part and the second part comprise a slider-pivot hinge mechanism, when the second part is in the first state, a length of an upper portion of the slider-pivot hinge mechanism is longer than that of a lower portion of the slider-pivot hinge mechanism; when the second part is in the second state, the length of the upper portion of the slider-pivot hinge mechanism is shorter than that of the lower portion of the slider-pivot hinge mechanism.

19. The foldable-slider device as claimed in claim 17, wherein the first display surface and the second display surface are free of being exposed when the second part is in the first state, a portion of the first display surface is exposed when the second part is in the second state;
  wherein the first display surface has a shortcut display portion, the portion exposed comprises a part of the shortcut display portion.

20. The foldable-slider device as claimed in claim 18, wherein the first part comprises a latch mechanism which makes the second part latch to the second state such that there is a de-latch point in the first part, when the second part slides beyond the de-latch point, the second part is released from the first part and is capable of opening relative to the first part by rotating the second part around the hinge mechanism such that the second part is in a third state.

* * * * *